US012002831B2

(12) United States Patent
Yamagishi et al.

(10) Patent No.: US 12,002,831 B2
(45) Date of Patent: Jun. 4, 2024

(54) SEMICONDUCTOR DEVICE

(71) Applicant: SONY SEMICONDUCTOR SOLUTIONS CORPORATION, Kanagawa (JP)

(72) Inventors: Hajime Yamagishi, Kanagawa (JP); Eiji Sato, Kanagawa (JP); Akira Yamazaki, Kanagawa (JP); Takayuki Sekihara, Kanagawa (JP); Makoto Hayafuchi, Kanagawa (JP); Syunsuke Ishizaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 641 days.

(21) Appl. No.: 17/266,838

(22) PCT Filed: Aug. 2, 2019

(86) PCT No.: PCT/JP2019/030391
§ 371 (c)(1),
(2) Date: Feb. 8, 2021

(87) PCT Pub. No.: WO2020/044943
PCT Pub. Date: Mar. 5, 2020

(65) Prior Publication Data
US 2021/0351219 A1  Nov. 11, 2021

(30) Foreign Application Priority Data
Aug. 31, 2018 (JP) .................. 2018-162382

(51) Int. Cl.
*H01L 27/146* (2006.01)
*H01L 23/00* (2006.01)

(52) U.S. Cl.
CPC ........ *H01L 27/14634* (2013.01); *H01L 24/05* (2013.01); *H01L 24/08* (2013.01);
(Continued)

(58) Field of Classification Search
None
See application file for complete search history.

(56) References Cited

U.S. PATENT DOCUMENTS

2013/0107075 A1    5/2013   Kobayashi
2016/0020240 A1    1/2016   Hayashi
(Continued)

FOREIGN PATENT DOCUMENTS

CN    102629616 A    8/2012
CN    104916611 A    9/2015
(Continued)

OTHER PUBLICATIONS

International Search Report prepared by the Japan Patent Office dated Sep. 18, 2019, for International Application No. PCT/JP2019/030391.

*Primary Examiner* — Asok K Sarkar
(74) *Attorney, Agent, or Firm* — Sheridan Ross PC

(57) ABSTRACT

Effective use is achieved of a region in a proximity of a joining plane of semiconductor substrates in a semiconductor device including a stacked semiconductor substrate in which multilayer wiring layers of a plurality of semiconductor substrates are electrically connected to each other. The stacked semiconductor substrate includes plural semiconductor substrates on each of which a multilayer wiring layer is formed. In this stacked semiconductor substrate, the multilayer wiring layers are joined together and electrically connected to each other. In the proximity of a joining plane of the plurality of semiconductor substrates, a conductor is formed. This conductor is formed such that it is electrified in a direction of the joining plane.

14 Claims, 47 Drawing Sheets

(52) U.S. Cl.
CPC ................ *H01L 27/14636* (2013.01); *H01L 2224/05553* (2013.01); *H01L 2224/08146* (2013.01)

(56) References Cited

U.S. PATENT DOCUMENTS

| | | |
|---|---|---|
| 2017/0358553 A1 | 12/2017 | Kim |
| 2018/0047767 A1 | 2/2018 | Ando |
| 2018/0233523 A1 | 8/2018 | Kobayashi |
| 2019/0386052 A1* | 12/2019 | Furuhashi ............... H01L 27/08 |

FOREIGN PATENT DOCUMENTS

| | | |
|---|---|---|
| JP | 2012064709 A | 3/2012 |
| JP | 2013073988 A | 4/2013 |
| JP | 2014082514 A | 5/2014 |
| JP | 5693060 B2 | 4/2015 |
| JP | 2018-101699 | 6/2018 |
| KR | 20180037620 A | 4/2018 |
| TW | 201803100 A | 1/2018 |
| WO | WO-2018116559 A1 | 6/2018 |

* cited by examiner

FIG. 2
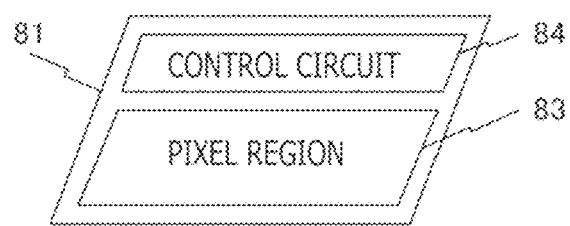
a
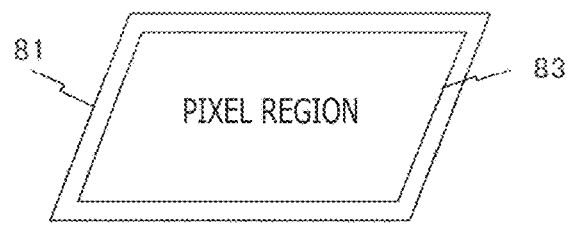
b
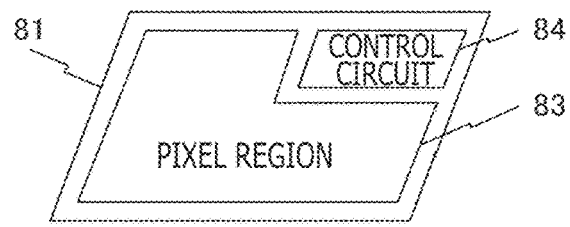
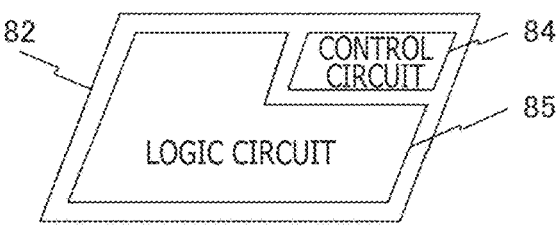
c

FIG. 6
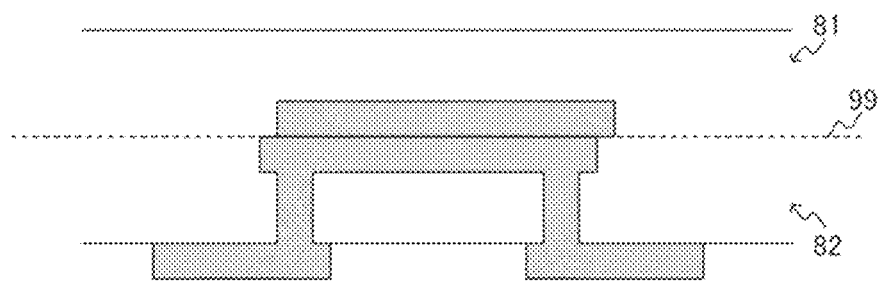
a
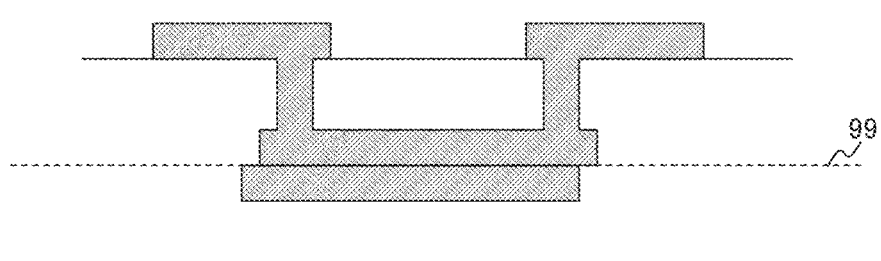
b

FIG.9
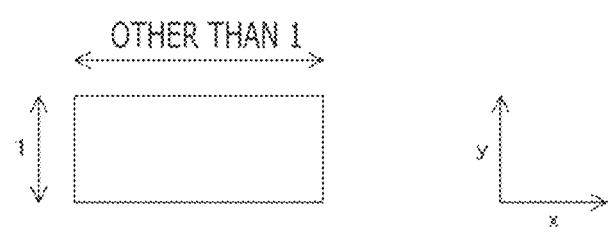
a
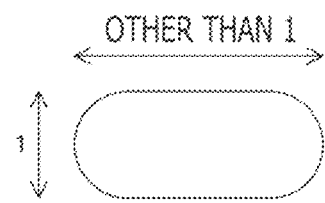
b
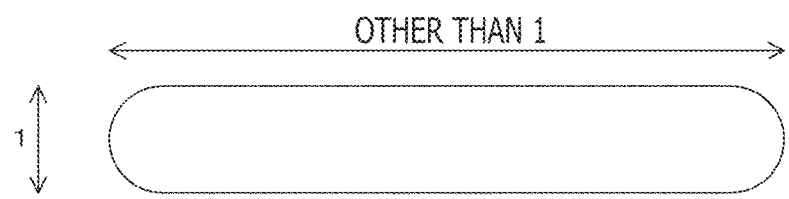
c

FIG.10
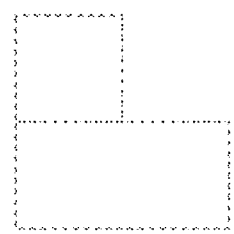
a
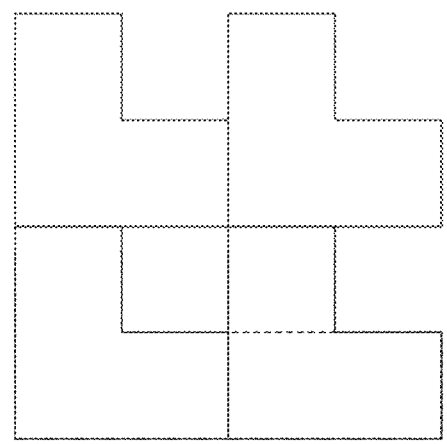
b

FIG. 11
| | UPPER AND LOWER LINE WIDTHS = SAME | UPPER AND LOWER LINE WIDTHS ≠ SAME | ONE SIDE JOINING |
|---|---|---|---|
| WIRING JOINING | 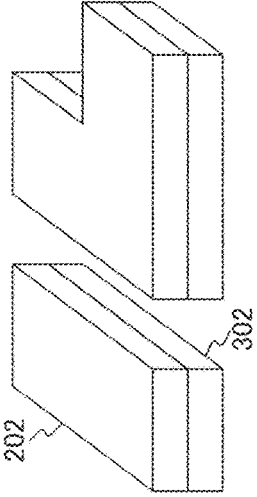 202, 302 | 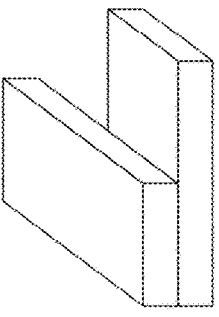 | 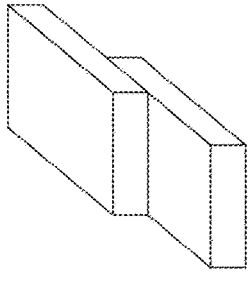 |
| ORTHOGONAL JOINING | 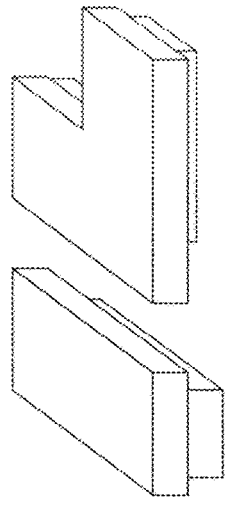 | 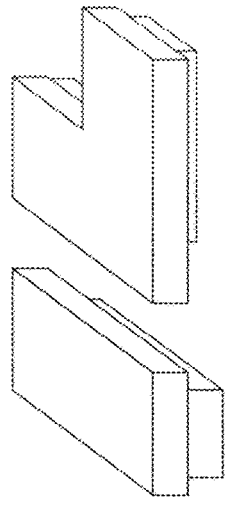 | |
| PARALLEL JOINING | 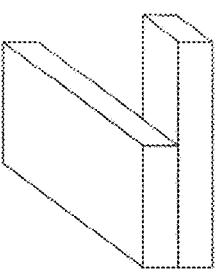 | 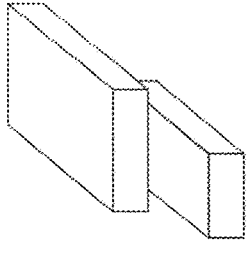 | |

FIG.42
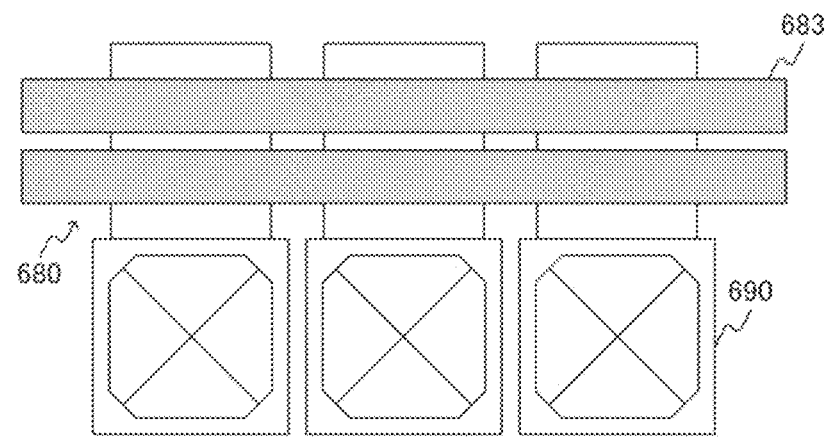
a
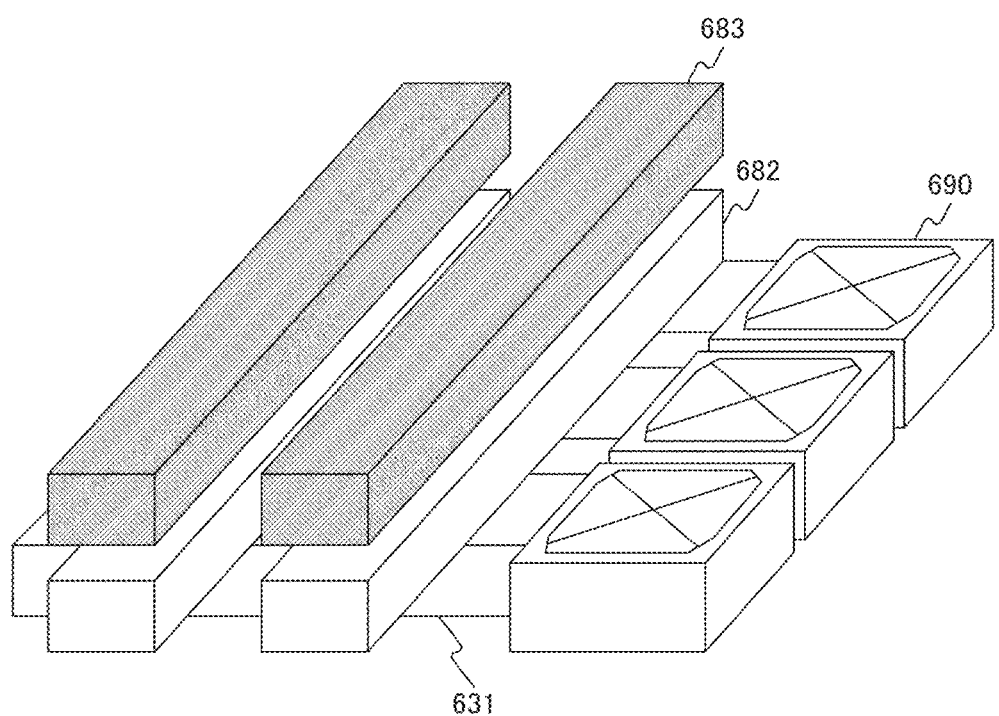
b

SEMICONDUCTOR DEVICE

CROSS REFERENCE TO RELATED APPLICATIONS

This application is a national stage application under 35 U.S.C. 371 and claims the benefit of PCT Application No. PCT/JP2019/030391 having an international filing date of 2 Aug. 2019, which designated the United States, which PCT application claimed the benefit of Japanese Patent Application No. 2018-162382, filed 31 Aug. 2018, the entire disclosures of each of which are incorporated herein by reference.

TECHNICAL FIELD

The present technology relates to a semiconductor device. Particularly, the present technology relates to a semiconductor device including a stacked semiconductor substrate in which multilayer wiring layers of a plurality of semiconductor substrates are electrically connected to each other.

BACKGROUND ART

In recent years, digital cameras have been and are becoming more and more popular. Together with this, the demand for a solid-state imaging device (image sensor) that is a central part of digital cameras is increasing more and more. In regard to performance of a solid-state imaging device, technical development for implementing higher picture quality and higher functions is advanced. On the other hand, popularization of portable terminals having an imaging function (portable telephone sets, PDAs (Personal Digital Assistants), notebook PCs (Personal Computers), tablet PCs and so forth) is also proceeding. Together with this, in order to increase the portability of such portable terminals, reduction in size, reduction in weight, and reduction in thickness of solid-state imaging devices and parts configuring the solid-state imaging devices are being advanced. Further, in order to increase the popularization of such portable terminals, reduction in cost of solid-state imaging devices and parts for configuring the solid-state imaging devices is also being advanced.

Generally, a solid-state imaging device (for example, a solid-state imaging device of the MOS (Metal Oxide Semiconductor) type is configured by forming a photoelectric conversion portion, an amplification circuit, and a multilayer wiring layer on the light receiving face side of a silicon substrate and forming color filters and on-chip microlenses on them. Further, a glass cover is pasted to the light receiving face side with a spacer of bonding agent or the like. Further, on the side opposite to the light receiving face, terminals are formed. To this solid-state imaging device, a signal processing circuit that performs predetermined processing for a signal outputted from the solid-state imaging device is connected. Together with multi-functioning of the solid-state imaging device, processes to be performed by the signal processing circuit also tend to increase.

In order to downsize a configuration in which a plurality of semiconductor substrates is connected in such a manner, various measures are taken. To seal a plurality of semiconductor substrates in one package, for example, by an SiP (System in Package) technology is performed. This makes it possible to reduce the mounting area and implement downsizing of the overall configuration. However, according to the SiP, there is the possibility that the transmission distance may increase by wirings for interconnecting the semiconductor substrates, resulting in hindrance of high speed operation.

In this regard, a solid-state imaging device has been proposed which is configured by joining a first semiconductor substrate including a pixel region and a second semiconductor substrate including logic circuits to each other by pasting (for example, refer to PTL 1). Such a configuration as just described makes it possible to transmit a signal at a high speed. According to this solid-state imaging device, the first semiconductor substrate including a pixel array and a second semiconductor substrate including logic circuits, both of which are in a semi-finished product condition, are pasted together, and the first semiconductor substrate is made thinner, whereafter the pixel array and the logic circuits are connected. Here, the connection is performed by forming connection wirings including a connection conductor for the connection to a required wiring of the first semiconductor circuit, a through connection conductor that extends through the first semiconductor substrate and connects to a required wiring of the second semiconductor substrate, and a connecting conductor that connects both of the connection conductors to each other. Thereafter, the solid-state imaging device is chipped in a finished product state and is configured as a solid-state imaging device of the back-illuminated type.

On the other hand, a method has been proposed which, in a solid-state imaging device in which a plurality of semiconductor substrates is joined together, takes out copper (Cu) electrodes to the surface of both semiconductor substrates and connects them without using an electric connection method by through connection conductors (for example, refer to PTL 2).

CITATION LIST

Patent Literature

[PTL 1]
    JP 2012-064709A
[PTL 2]
    JP 2013-073988A

SUMMARY

Technical Problem

In the related art described above, in a solid-state imaging device in which a plurality of semiconductor substrates is joined together, copper electrodes are taken out to the surface of both semiconductor substrates and connected to each other. However, on the joining plane or in the proximity of the joining plane of a semiconductor substrate, a dummy pattern of a conductor in a floating state or an oxide film that is an insulator on which no conductor is arranged are also arranged, and there is a problem that effective use is not necessarily achieved.

The present technology has been created in view of such a situation as described above, and it is an object of the present technology to achieve effective use of a region in the proximity of a joining plane of a semiconductor substrate.

Solution to Problem

The present technology has been made in order to eliminate the problem described above, and a first aspect of the present technology is a semiconductor device. In a stacked semiconductor substrate in which plural semiconductor substrates on each of which a multilayer wiring layer is formed are joined together with the multilayer wiring layers electrically connected to each other, a conductor formed in a proximity of a joining plane of the plurality of semiconductor substrates is electrified in a direction of the joining plane. This brings action that a region in the proximity of the joining plane of the semiconductor substrates can be used effectively.

Further, in this first aspect, at least some of the conductors formed in the proximity of the joining plane may have a plane long side equal to or greater than twice a width of a connection face. This brings action that the conductor effectively functions as a wiring.

Further, in this first aspect, only one of the conductors opposing on the joining plane to at least some of the conductors formed in the proximity of the joining plane may have a connection hole in the semiconductor substrate. This brings action that the conductor functions as a wiring for one of the semiconductor substrates.

Further, in this first aspect, at least some of the conductors formed in the proximity of the joining plane may not be electrically connected to the conductor on the other semiconductor substrate. This brings action that the conductor functions as a wiring only on one of the semiconductor substrates.

Further, in this first aspect, at least some of the conductors formed in the proximity of the joining plane may be different in shape from the conductor opposing thereto on the joining plane. Further, at least some of the conductors formed in the proximity of the joining plane may be joined to the conductor opposing thereto on the joining plane in a displaced relation by a predetermined direction in a direction of the joining plane.

Further, in this first aspect, preferably at least some of the conductors formed in the proximity of the joining plane have a shape having a plane aspect ratio higher than one. Along with this, at least some of the conductors formed in the proximity of the joining plane may be joined to the conductor opposed thereto on the joining plane so as to cross with each other in a longitudinal direction on the joining plane or at least some of the conductors formed in the proximity of the joining plane may be joined to the conductor opposed thereto on the joining plane so as to extend in parallel in a longitudinal direction on the joining plane.

Further, in this first aspect, at least some of the conductors formed in the proximity of the joining plane may have a rectangular shape or an elliptical shape having a plane aspect ratio higher than one or may have a polygonal shape configured from a combination of rectangles having a plane aspect ratio higher than one.

Further, in this first aspect, at least some of the conductors formed in the proximity of the joining plane may be provided in a region that surrounds an inner side circumference of an input/output pad. Further, at least some of the conductors formed in the proximity of the joining plane may be provided in a rectangular region on an inner side of an input/output pad.

Further, in this first aspect, at least some of the conductors formed in the proximity of the joining plane may be provided in parallel to a power supply wiring. This brings action that reduction in resistance of the power supply wiring is achieved.

Advantageous Effect of Invention

According to the present technology, such a superior advantageous effect can be anticipated that effective use of a region in the proximity of the joining plane of the semiconductor substrate is achieved. It is to be noted that the advantageous effect described here is not necessarily restrictive and some advantageous effect described in the present technology may be applicable.

BRIEF DESCRIPTION OF DRAWINGS

FIG. 2 illustrates views depicting examples of division of a substrate of the solid-state imaging device in the embodiment of the present technology.

FIG. 6 is a second view depicting examples of the structure of the copper wirings 202 and 302 used as wirings in the embodiment of the present technology.

FIG. 9 is a view depicting a first example of a shape on a wiring plane of a connection hole in the embodiment of the present technology.

FIG. 10 is a view depicting a second example of the shape on the wiring plane of the connection hole in the embodiment of the present technology.

FIG. 11 is a first view depicting examples of joining of the copper wirings 202 and 302 used as wirings in the embodiment of the present technology.

FIG. 36 is a view depicting a first example of arrangement of a power supply wiring in the embodiment of the present technology.

FIG. 42 is a view depicting an example of application of a copper wiring 683 to a power supply wiring ring 680 in the embodiment of the present technology.

DESCRIPTION OF EMBODIMENT

In the following, a mode for carrying out the present technology (hereinafter referred to as an embodiment) is described. The description is given in the following order.
1. Semiconductor Device
2. Conductor Using Wiring
3. Joining Plane
4. Fabrication Process
5. Example of Application to Power Supply Wiring
6. Example of Application to Endoscopic Surgery System
7. Example of Application to Mobile Body <1. Semiconductor Device>

[Configuration of Solid-State Imaging Device]

Figure 1:
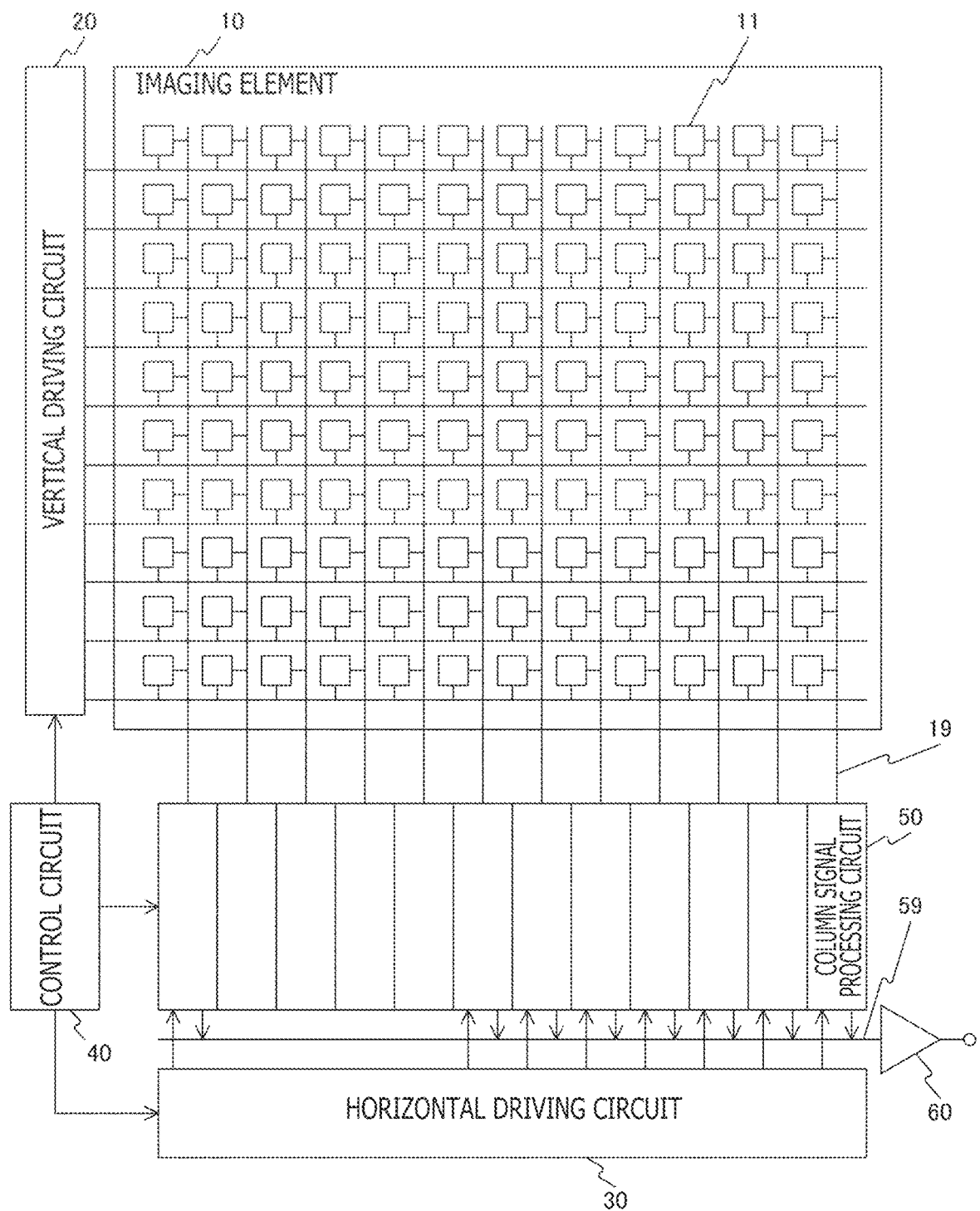
FIG. 1 is a view depicting an example of a configuration of a solid-state imaging device that is an example of a semiconductor device according to an embodiment of the present technology.

FIG. 1 is a view depicting an example of a configuration of a solid-state imaging device that is an example of a semiconductor device in an embodiment of the present technology. This solid-state imaging device is configured as a CMOS (Complementary Metal Oxide Semiconductor) image sensor. This solid-state imaging device includes an imaging element 10 and a peripheral circuit section on a semiconductor substrate (not depicted) (for example, a silicon substrate). The peripheral circuit section includes a vertical driving circuit 20, a horizontal driving circuit 30, a control circuit 40, a column signal processing circuit 50, and an outputting circuit 60.

The imaging element 10 is a pixel array in which a plurality of pixels 11 including a photoelectric conversion portion is arrayed in a two-dimensional array. Each pixel 11 includes, for example, a photodiode that serves as the photoelectric conversion portion, and a plurality of pixel transistors. Here, the plurality of pixel transistors can include three transistors of, for example, a transfer transistor, a reset transistor, and an amplification transistor. It is also possible to configure the plurality of pixel transistors from four transistors with a selection transistor added. It is to be noted that, since an equivalent circuit of a unit pixel is similar to a general one, detailed description of the same is omitted.

Further, it is possible to configure the pixel 11 as one unit pixel or in a pixel sharing structure. This pixel sharing structure is a structure in which a plurality of photodiodes shares transistors other than a floating diffusion and a transfer transistor.

The vertical driving circuit 20 drives the pixels 11 in a unit of a row. The vertical driving circuit 20 includes, for example, a shift register. The vertical driving circuit 20 selects a pixel driving wiring and supplies a pulse for driving a pixel 11 to the selected pixel driving wiring. Consequently, the vertical driving circuit 20 selectively scans the pixels 11 of the imaging element 10 sequentially in the vertical direction in a unit of a row and supplies a pixel signal based on signal charge generated according to a reception light amount in the photoelectric conversion portion of each pixel 11 to the column signal processing circuit 50 through a vertical signal line (VSL) 19.

The horizontal driving circuit 30 drives the column signal processing circuits 50 in a unit of a column. The horizontal driving circuit 30 includes, for example, a shift register. The horizontal driving circuit 30 sequentially outputs horizontal scanning pulses to sequentially select each of the column signal processing circuits 50 such that a pixel signal is outputted from each of the column signal processing circuits 50 to a horizontal signal line 59.

The control circuit 40 controls the entire solid-state imaging device. The control circuit 40 receives an input clock and data for instructing an operation mode or the like and outputs data of internal information of the solid-state imaging device and so forth. In particular, the control circuit 40 generates a clock signal that servers as a reference for operation of and control signals for the vertical driving circuit 20, the column signal processing circuit 50, the horizontal driving circuit 30 and so forth, on the basis of a vertical synchronizing signal, a horizontal synchronizing signal, and a master clock. Then, the control circuit 40 inputs the signals to the vertical driving circuit 20, the column signal processing circuit 50, the horizontal driving circuit 30 and so forth.

The column signal processing circuit 50 is arranged, for example, for each column of the pixels 11 and performs signal processing such as noise removal for each pixel column for signals outputted from the pixel 11 of one row. In particular, the column signal processing circuit 50 performs signal processing such as CDS (Correlated Double Sampling) for removing fixed pattern noise unique to the pixels 11, signal amplification, and AD (Analog/Digital) conversion. In the output stage of the column signal processing circuit 50, a horizontal selection switch (not depicted) is connected to the horizontal signal line 59.

The outputting circuit 60 performs signal processing for signals sequentially supplied thereto from each of the column signal processing circuits 50 through the horizontal signal line 59 and outputs resulting signals. Along with this, the outputting circuit 60 buffers a signal from the column signal processing circuit 50. Further, the outputting circuit 60 may perform, for a signal from the column signal processing circuit 50, black level adjustment, column dispersion correction, various digital signal processes and so forth.

FIG. 2 illustrates views depicting examples of division of a substrate of the solid-state imaging device in the embodiment of the present technology.

In FIG. 2, a depicts a first example. This first example includes a first semiconductor substrate 81 and a second semiconductor substrate 82. A pixel region 83 and a control circuit 84 are mounted on the first semiconductor substrate 81. A logic circuit 85 including a signal processing circuit is mounted on the second semiconductor substrate 82. Further, the first semiconductor substrate 81 and the second semiconductor substrate 82 are electrically connected to each other to configure a solid-state imaging device as one semiconductor chip.

b of FIG. 2 depicts a second example. This second example includes a first semiconductor substrate 81 and a second semiconductor substrate 82. A pixel region 83 is mounted on the first semiconductor substrate 81. A logic circuit 85 including a control circuit 84 and a signal processing circuit is mounted on the second semiconductor substrate 82. Further, the first semiconductor substrate 81 and the second semiconductor substrate 82 are electrically connected to each other to configure a solid-state imaging device as one semiconductor chip.

In FIG. 2, c depicts a third example. This third example includes a first semiconductor substrate 81 and a second semiconductor substrate 82. A pixel region 83 and a control circuit 84 that controls the pixel region 83 are mounted on the first semiconductor substrate 81. A logic circuit 85 including a signal processing circuit and a control circuit 84 that controls the logic circuit 85 are mounted on the second semiconductor substrate 82. Further, the first semiconductor substrate 81 and the second semiconductor substrate 82 are electrically connected to each other to configure a solid-state imaging device as one semiconductor chip.

[Stacked Semiconductor Substrate]

Figure 3:
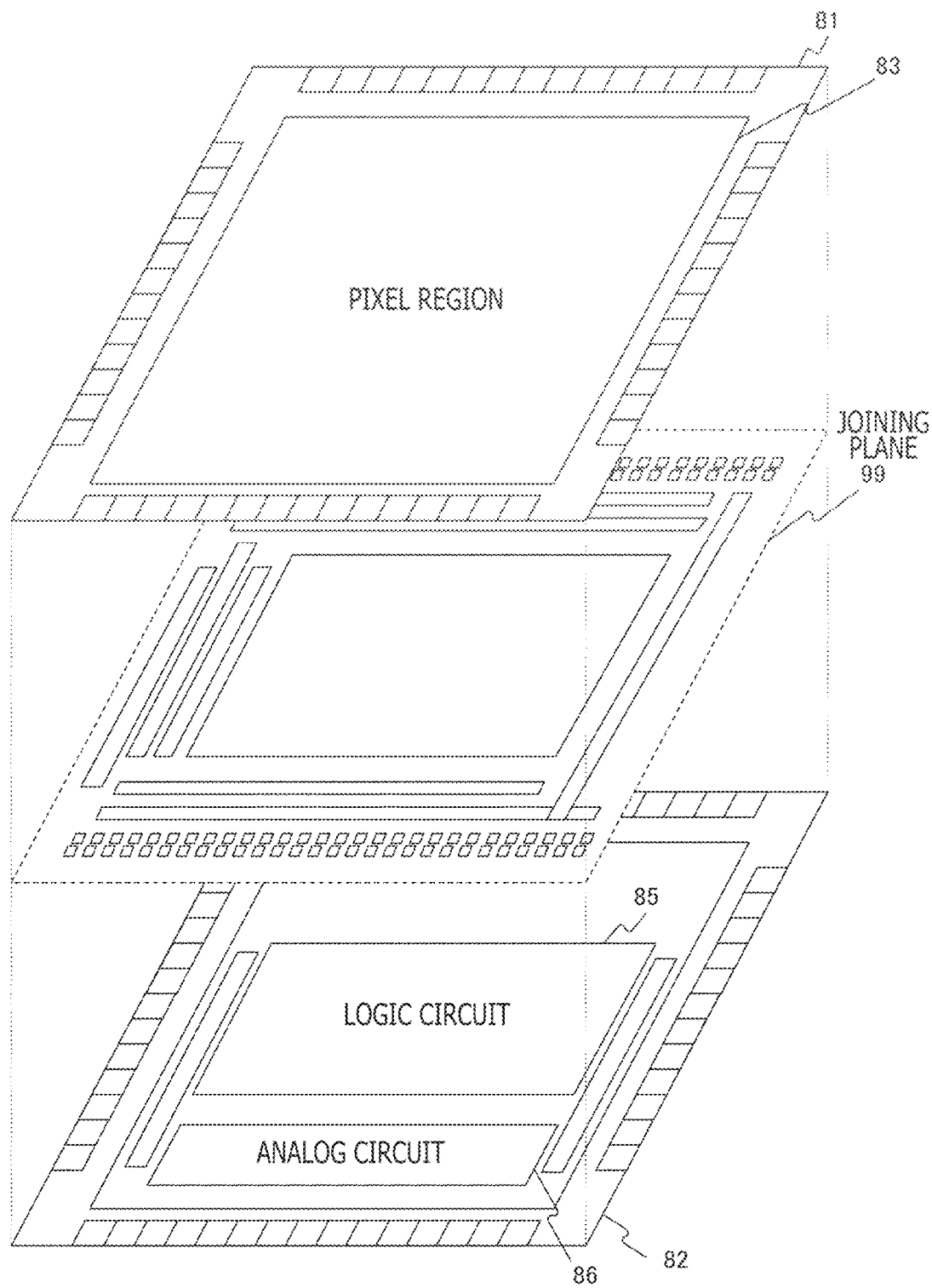
FIG. 3 is a view depicting an example of a relation between division of a substrate and a joining plane of the solid-state imaging device in the embodiment of the present technology.

FIG. 3 is a view depicting an example of a relation between division and a joining plane of a substrate of the solid-state imaging device in the embodiment of the present technology.

In this solid-state imaging device, a CMOS solid-state imaging element of the back-illuminated type is assumed. In particular, a first semiconductor substrate 81 including a pixel region 83 that is a light receiving section is placed at an upper portion of a second semiconductor substrate 82 that includes a logic circuit 85 and an analog circuit 86. By this, a CMOS solid-state imaging element of increased sensitivity and decreased noise in comparison with that of the surface-illuminated type is implemented.

A joining plane 99 virtually depicts a joining plane between the first semiconductor substrate 81 and the second semiconductor substrate 82. On the joining plane 99, the first semiconductor substrate 81 and the second semiconductor substrate 82 are pasted to each other so that wirings in the proximity of the joining plane directly join together in such a manner that the multilayer wiring layers of them are opposed to each other.

Figure 4:
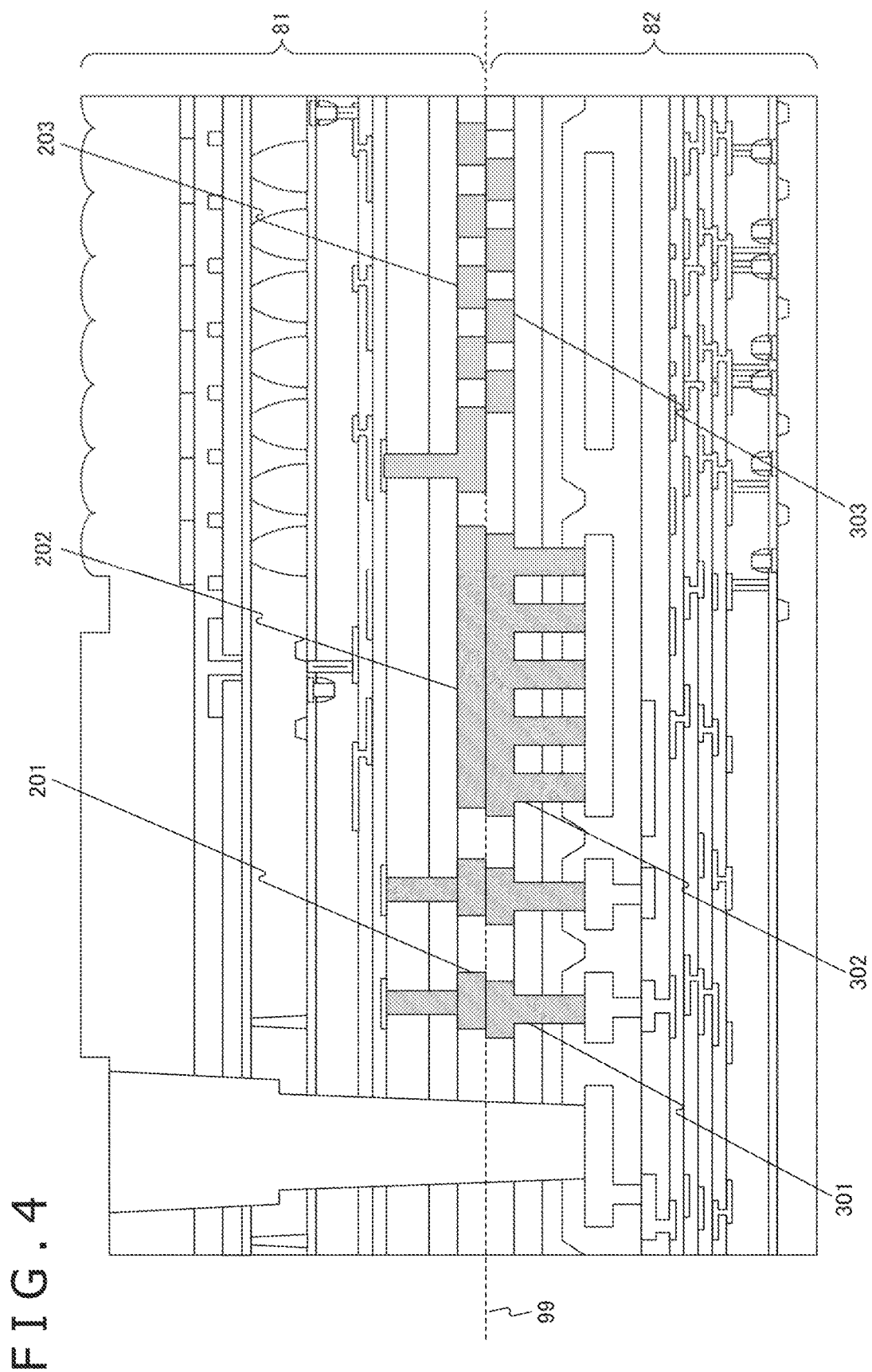
FIG. 4 is a view depicting an example of a sectional schematic view of the solid-state imaging device in the embodiment of the present technology.

FIG. 4 is a view depicting an example of a sectional schematic view of the solid-state imaging device in the embodiment of the present technology.

In this solid-state imaging device, the first semiconductor substrate 81 and the second semiconductor substrate 82 are pasted to each other at the joining plane 99 as described above. In this example, as an example of conductors to be formed in the proximity of the joining plane, copper (Cu) wirings are assumed, and copper wirings 201 to 203 of the first semiconductor substrate 81 and copper wirings 301 to 303 of the second semiconductor substrate 82 are directly joined together.

The copper wirings 201 and 301 have a use for establishing electric connection between the first semiconductor substrate 81 and the second semiconductor substrate 82. In particular, both of the copper wirings 201 and 301 have connection holes and are formed such that they are connected to the inside of the respective substrates.

The copper wirings 202 and 302 have a use that they are used as wirings in the second semiconductor substrate 82. In particular, the copper wiring 302 is used as a wiring of the second semiconductor substrate 82. On the other hand, the copper wiring 202 is joined to the copper wiring 302 without having a connection hole. By such use as a wiring, the degree of freedom in designing is improved.

The copper wirings 203 and 303 are connected to a potential in the first semiconductor substrate 81 such that it has a use as a shield. Consequently, crosstalk between wirings of the upper and lower substrates can be suppressed.

<2. Conductor Using Wiring>

[Form of Wiring Use]

Figure 5:
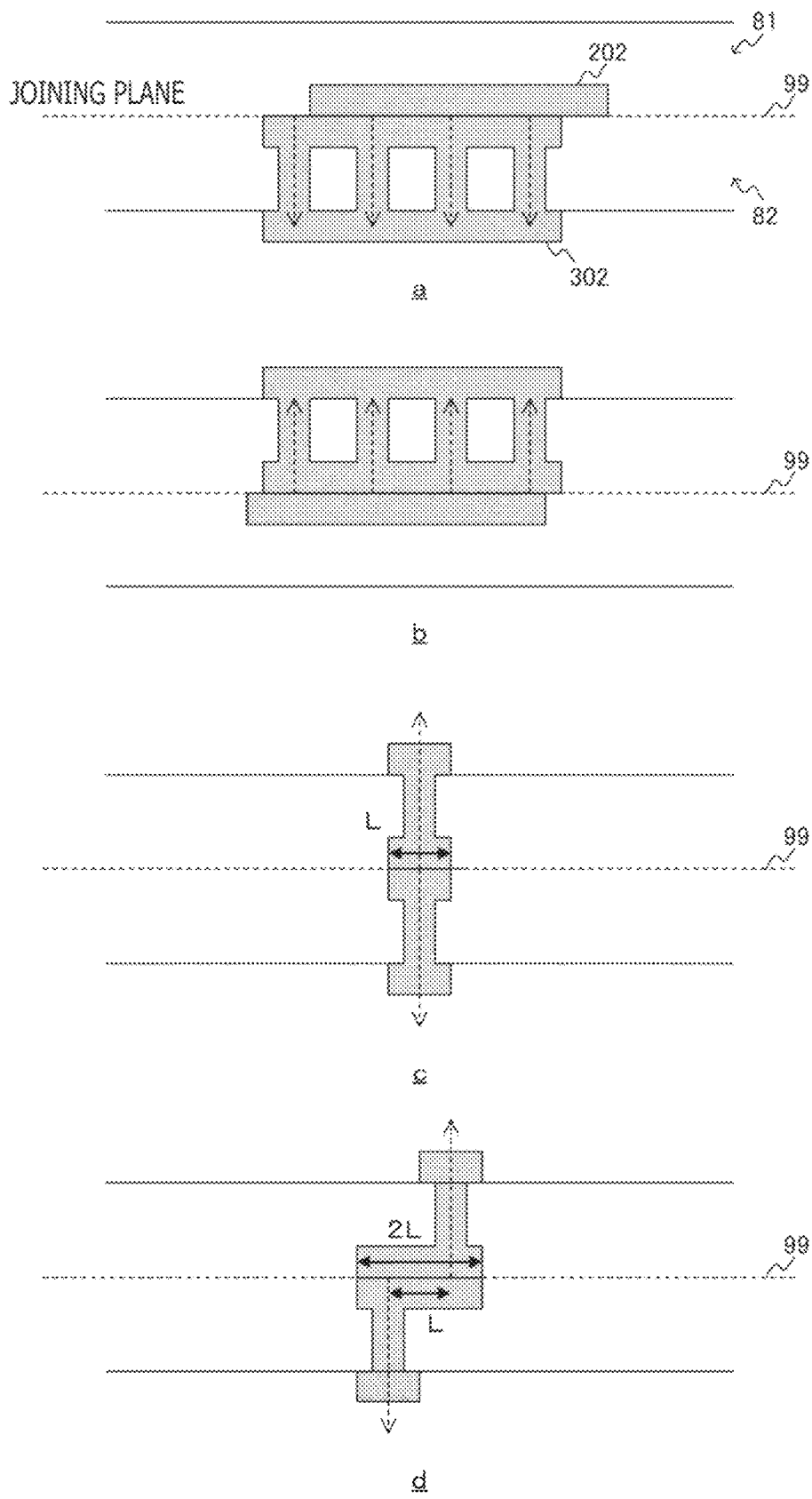
FIG. 5 is a first view depicting examples of a structure of copper wirings 202 and 302 used as wirings in the embodiment of the present technology.

FIG. 5 is a first view depicting examples of a structure of the copper wirings 202 and 302 used as wirings in the embodiment of the present technology.

In FIG. 5, a depicts a structure in which the copper wiring 202 of the first semiconductor substrate 81 does not have a connection hole while the copper wiring 302 of the second semiconductor substrate 82 has a plurality of connection holes. In this structure, the copper wiring 302 is connected to a lower layer wiring through a plurality of connection holes in which rivets are fitted such that it has a potential equal to that of the lower layer wiring. Consequently, electric current flows through the joining plane 99, and the copper wiring 302 functions as a wiring of the second semiconductor substrate 82.

It is to be noted that, as the thickness of the copper wirings 202 and 302 at the joining plane 99, for example, approximately 1 micrometer can be assured. By this, the wiring resistance can be reduced.

b of FIG. 5 depicts a structure in which the copper wiring 302 of the second semiconductor substrate 82 does not have a connection hole while the copper wiring 202 of the first semiconductor substrate 81 has a plurality of connection holes. In this structure, the copper wiring 202 is connected to a lower layer wiring through a plurality of connection holes in which rivets are fitted such that it has a potential equal to that of the lower layer wiring. Consequently, electric current flows through the joining plane 99, and the copper wiring 202 functions as a wiring of the first semiconductor substrate 81.

In FIG. 5, d depicts a structure in which both of the copper wirings 202 and 302 of the first semiconductor substrate 81 and the second semiconductor substrate 82 have connection holes that are arranged in a displaced relation from each other. In this structure, even in electric connection use of the first semiconductor substrate 81 and the second semiconductor substrate 82, electric current flows through the joining plane 99, and the joining plane 99 functions as a wiring of the first semiconductor substrate 81 and the second semiconductor substrate 82. In this case, in order to allow functioning as a wiring, in the case where the width of such a minimum connection face as depicted in c of FIG. 5 is represented by L, a connection hole in which the length of the connection face in a lateral direction is 2L or more is defined as that for wiring use. At this time, it is desirable that opposite connection holes is arranged in a displaced relation from each other by L or more. For example, in the case where the width of the minimum connection face of the connection hole is 1.5 micrometers, the distance for wiring use is 3.0 micrometers or more. Accordingly, preferably the positions of the opposite connection holes are arranged in a displaced relation from each other by 1.5 micrometers or more.

As in the examples, a region in which a dummy is conventionally arranged can be used effectively, and it is possible to form an additional wiring layer to suppress a voltage drop (IR drop) by electric current of the lower layer wiring.

FIG. 6 is a second view depicting examples of a structure of the copper wirings 202 and 302 used as wirings in the embodiment of the present technology.

In FIG. 6, a is an example in which the copper wirings 202 and 302 in the proximity of the joining plane 99 are used as a single wiring of the second semiconductor substrate 82. On the other hand, in FIG. 6, b depicts an example in which the copper wirings 202 and 302 in the proximity of the joining plane 99 are used as a single wiring of the first semiconductor substrate 81. As in the examples, the conductors in the proximity of the joining plane 99 can be used as a single wiring.

Figure 7:
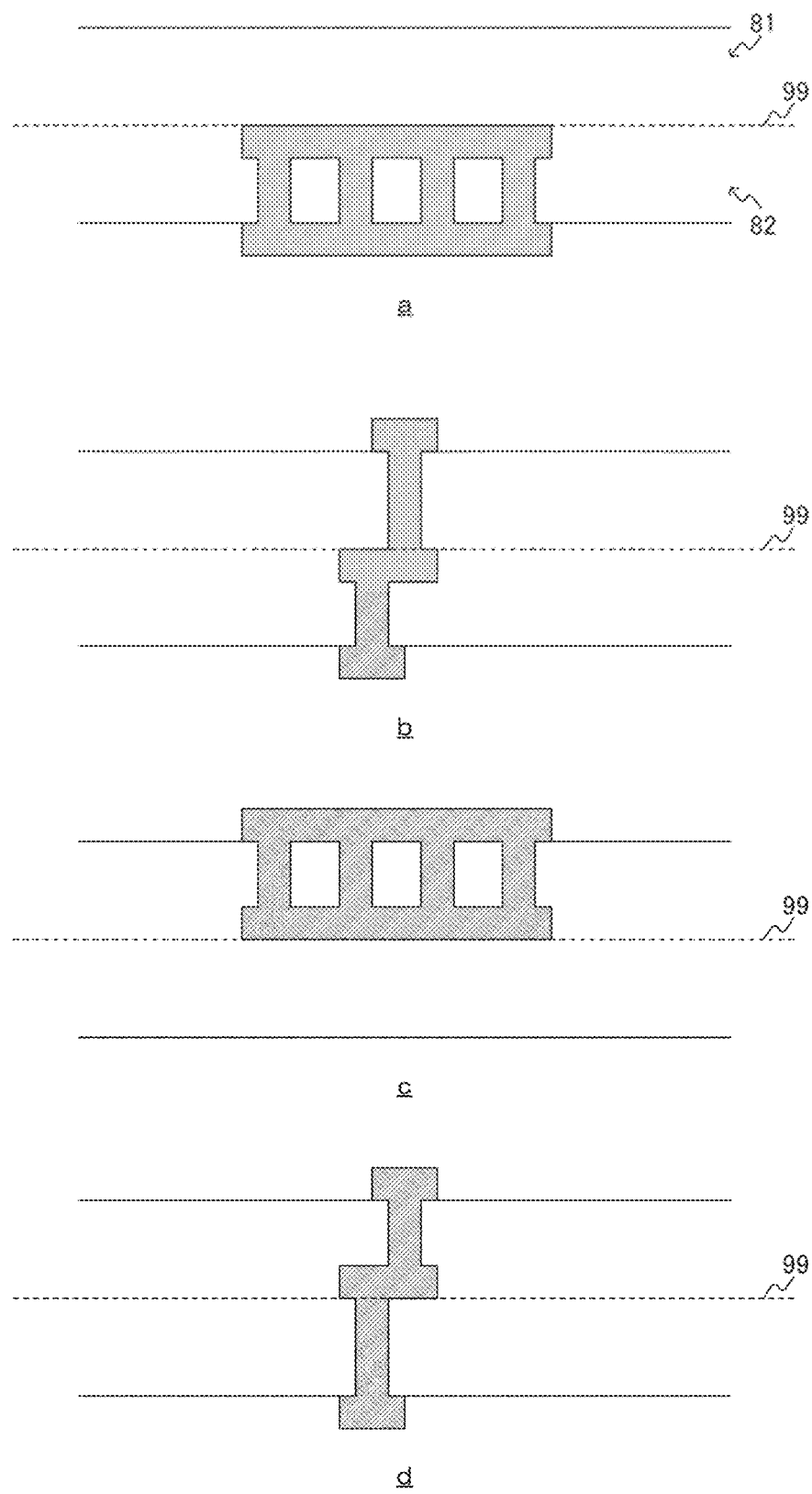
FIG. 7 is a third view depicting examples of the structure of the copper wirings 202 and 302 used as wirings in the embodiment of the present technology.
Figure 8:
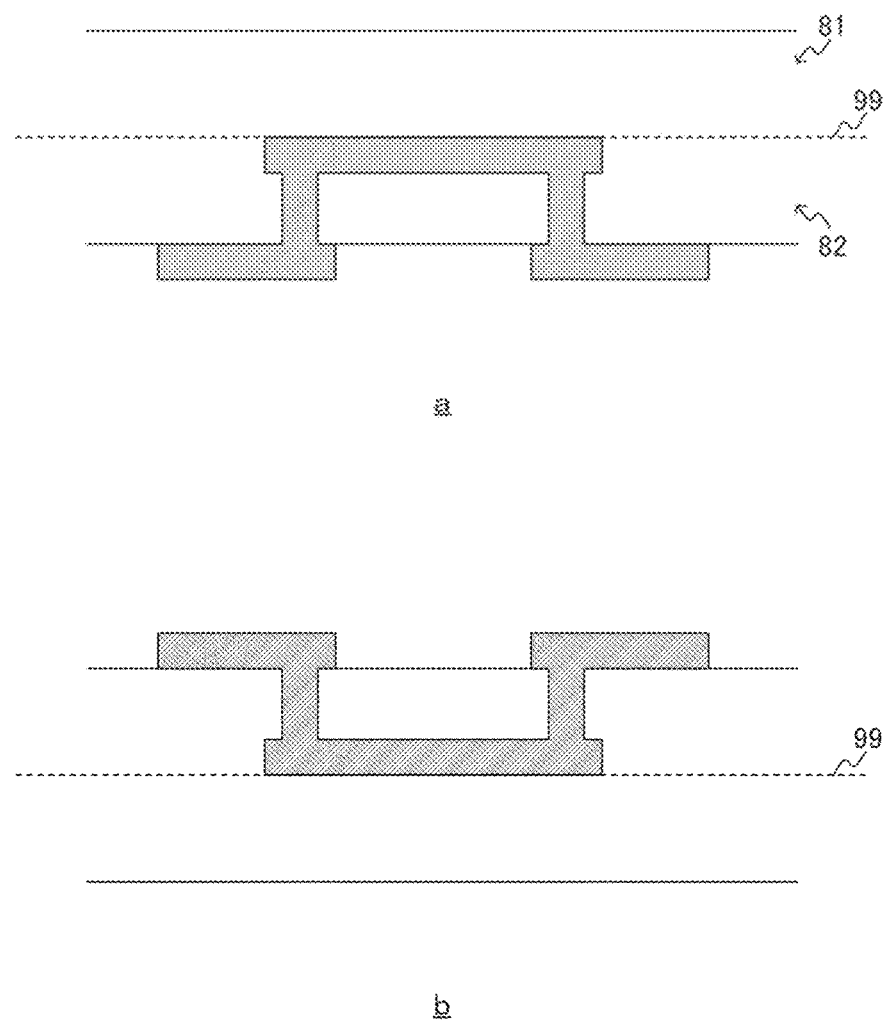
FIG. 8 is a fourth view depicting examples of the structure of the copper wirings 202 and 302 used as wirings in the embodiment of the present technology.

FIGS. 7 and 8 are third and fourth views depicting examples of a structure of the copper wirings 202 and 302 used as a wiring in the embodiment of the present technology.

Although, in the examples described above, both the first semiconductor substrate 81 and the second semiconductor substrate 82 have the copper wirings 202 and 302 on the joining plane 99, another structure may be applied in which only one of the substrates has a copper wiring while the other substrate is an insulator. In particular, as in a and b of FIG. 7 and a of FIG. 8, only the second semiconductor substrate 82 may have the copper wiring 302. On the other hand, as in c and d of FIG. 7 and b of FIG. 8, only the first semiconductor substrate 81 may have the copper wiring 202. They are effective in the case where it is necessary to suppress the conductor coverage in the proximity of the joining plane to a fixed level or less for fabrication reasons.

FIGS. 9 and 10 are views depicting examples of the shape on the wiring plane of a connection hole in the embodiment of the present technology.

Generally, a connection hole used in the multilayer wiring technology has such a shape that the horizontal x and vertical y aspect ratio (Aspect Ratio) is roughly 1. In contrast, the connection hole in the embodiment of the present technology may have a rectangular shape, a polygonal shape, or an elliptical shape having an aspect ratio higher than one as depicted in FIG. 9. In other words, the shape of the connection hole is elongated in a wiring direction such that it also acts as an electric current path of low wiring resistance. Therefore, if an aspect ratio preferably of two or more is assured, then a higher wiring function is achieved effectively. As a particular length, a plane long side preferably has a length of 3 micrometers or more.

It is to be noted here that, although a shape elongated in the horizontal direction is indicated as an example of a shape whose aspect ratio is higher than one, it may otherwise be a shape elongated in the vertical direction. However, it is desirable from the point of view of the effect described above to elongate the connection hole along a direction of a supposed electric current path.

Further, a connection hole configured from a combination of rectangles whose aspect ratio is different from one may be used as depicted in FIG. 10. In particular, in the case where a shape whose aspect ratio is higher than one at any of the rectangles before the combination is used, it is conceivable to combine a plurality of them to form a shape of a connection hole that suits the object of the embodiment of the present technology.

[Form of Joining]

FIG. 11 is a first view depicting examples of joining of the copper wirings 202 and 302 used as a wiring in the embodiment of the present technology.

As depicted in the left column of FIG. 11, the copper wirings 202 and 302 opposing to each other on the joining plane 99 of the first semiconductor substrate 81 on the upper side and the second semiconductor substrate 82 on the lower side may have line widths equal to each other. In this case, generally the first semiconductor substrate 81 and the second semiconductor substrate 82 are joined together such that they coincide in shape with each other above and below (wiring coupling).

However, the copper wirings 202 and 302 may be joined together along the joining plane 99 such that the longitudinal directions of them are orthogonal to each other (orthogonal coupling). Alternatively, the copper wirings 202 and 302 may be joined together along the joining plane 99 such that they extend in parallel to each other (parallel coupling). Along with this, they may be joined together in a displaced relation from each other by a predetermined distance in the direction of the joining plane 99.

Further, the copper wirings 202 and 302 that are opposed to each other on the joining plane 99 of the first semiconductor substrate 81 on the upper side and the second semiconductor substrate 82 on the lower side may be different in line width or shape from each other as depicted in the middle column of FIG. 11. Also in this case, they can be joined together similarly as in the case where they have line widths equal to each other.

It is to be noted that, as indicated in the right column of FIG. 11, a copper wiring may be arranged on only one of the first semiconductor substrate 81 on the upper side or the second semiconductor substrate 82 on the lower side as described hereinabove.

Figure 12:
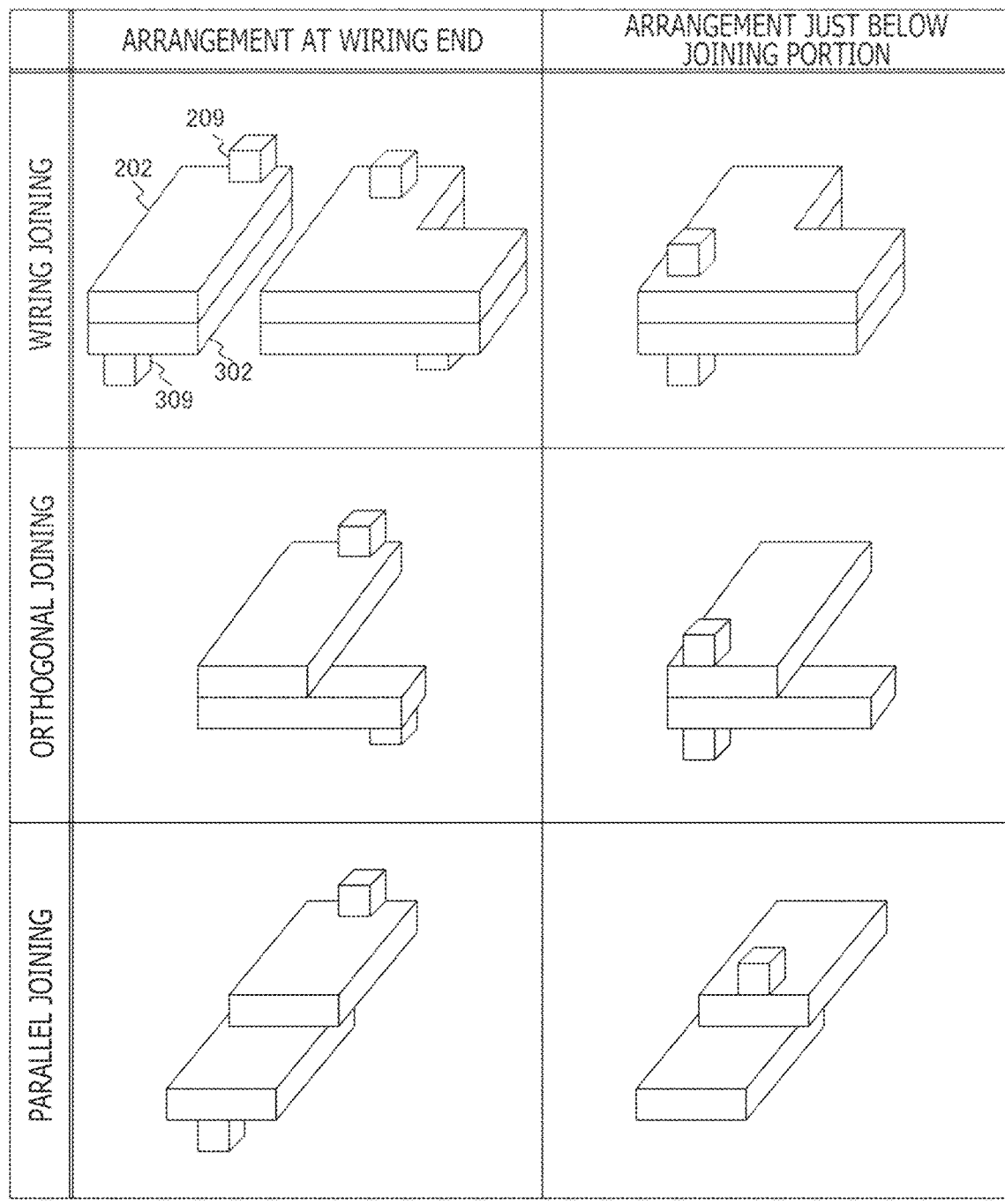
FIG. 12 is a second view depicting examples of joining of the copper wirings 202 and 302 used as wirings in the embodiment of the present technology.

FIG. 12 is a second view depicting examples of joining of the copper wirings 202 and 302 used as a wiring in the embodiment of the present technology.

In each of the wiring coupling, orthogonal coupling, and parallel coupling described hereinabove, the connection holes can be provided at any positions. For example, connection holes 209 and 309 may be formed at an end of wirings as depicted in the left column of FIG. 12. On the other hand, the connection holes 209 and 309 may be provided such that the positions of them coincide with each other as indicated in the right column of FIG. 12.

Figure 13:
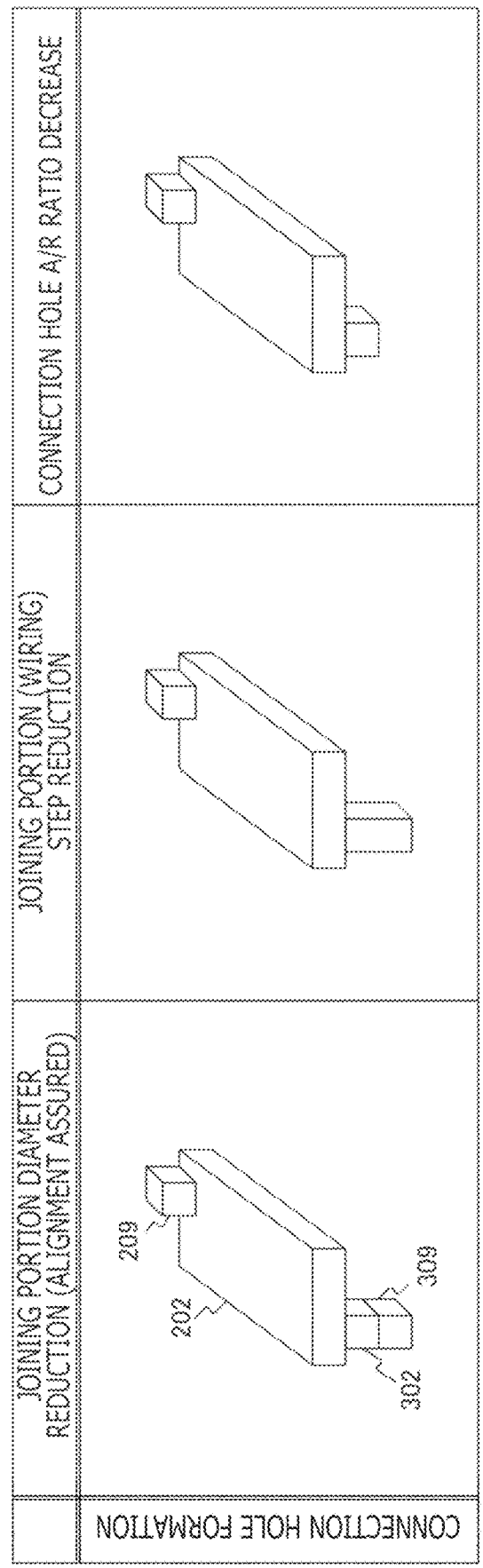
FIG. 13 is a third view depicting examples of joining of the copper wirings 202 and 302 used as wirings in the embodiment of the present technology.

FIG. 13 is a third view depicting examples of joining of the copper wirings 202 and 302 used as a wiring in the embodiment of the present technology.

As indicated in the left column of FIG. 13, a region for alignment may be assured by reducing the size of a copper wiring of one of the substrates (in the present example, the copper wiring 302 of the second semiconductor substrate 82). Along with this, the copper wiring 302 and the connection hole 309 may be formed in an integrated state as indicated in the middle column of FIG. 13. By this, a step can be reduced in comparison with an alternative case in which they are formed separately from each other. However, in the case where the embedding property of copper degrades, the aspect ratio of the connection hole may be reduced as depicted in the right column of FIG. 13 in order to improve the aspect ratio.

<3. Joining Plane>
[Floor Plan]

Figure 14:
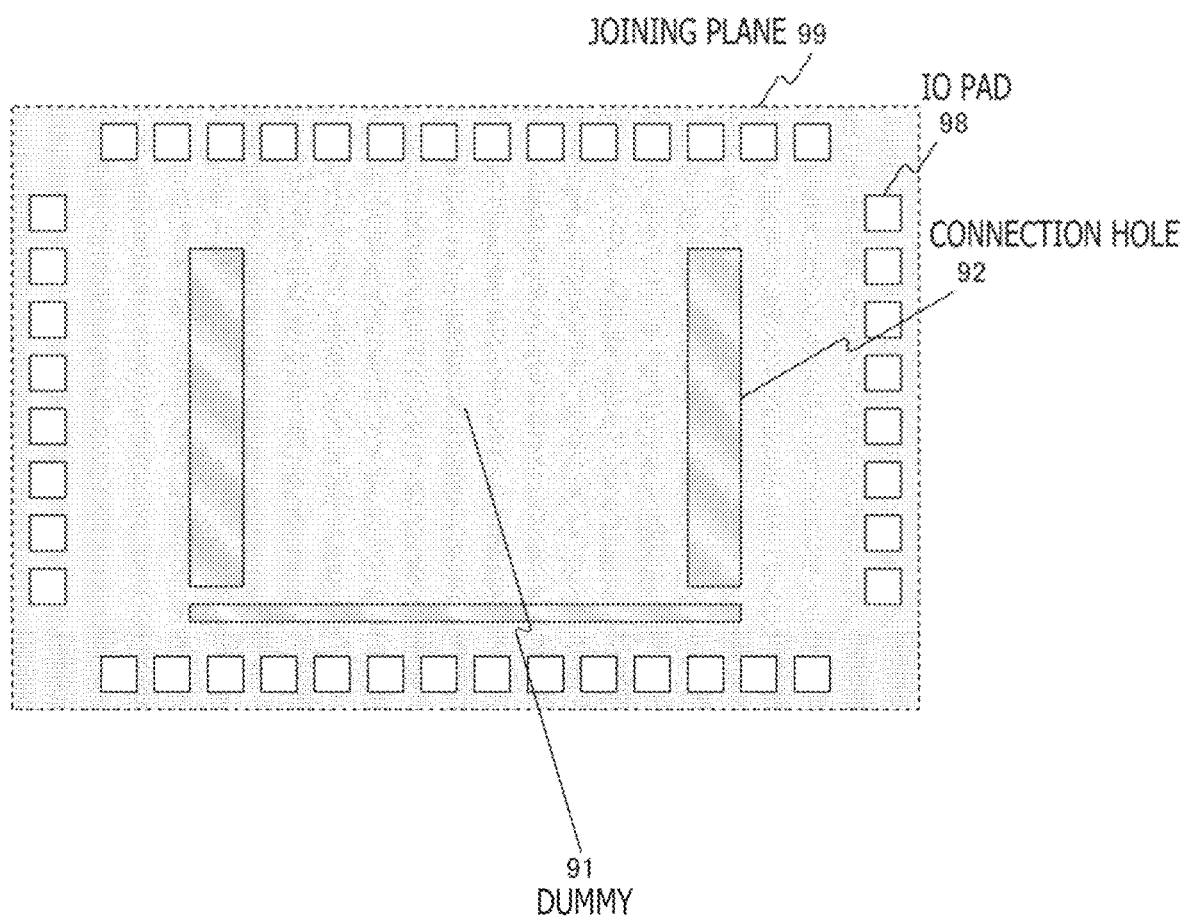
FIG. 14 is a view depicting a first example of a floor plan of a joining plane 99 in the embodiment of the present technology.

FIG. 14 is a view depicting a first example of a floor plan of the joining plane 99 in the embodiment of the present technology.

In this first example of the floor plan, a region for a copper wiring having a connection hole 92 is provided at part of the joining plane 99. In any other place, copper wirings of the dummy 91 are laid entirely. Regions for input/output (IO) pads 98 are provided on a periphery of the joining plane 99.

It is to be noted that, while, in this example, an example in which a copper wiring of a dummy 91 is arranged is depicted, the region other than that for a copper wiring may be formed only from an insulator without provision of the dummy 91.

Figure 15:
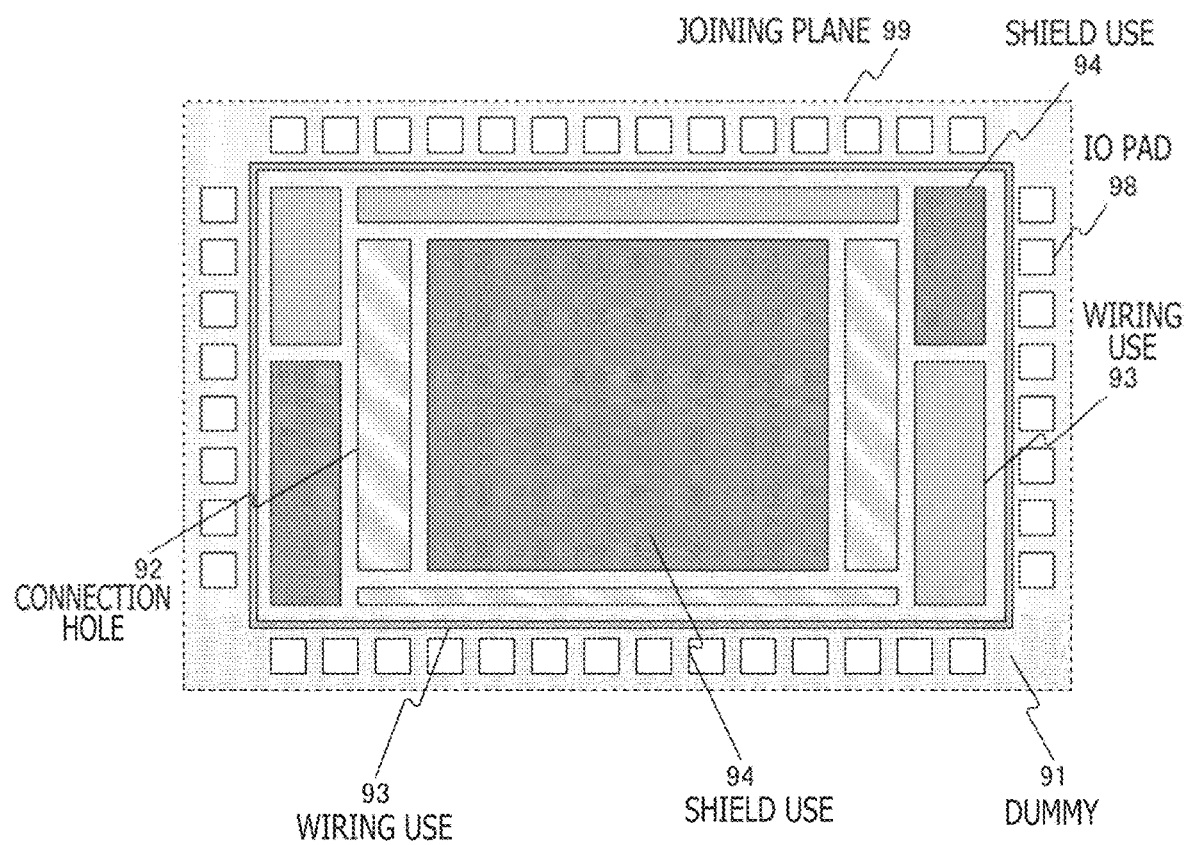
FIG. 15 is a view depicting a second example of the floor plan of the joining plane 99 in the embodiment of the present technology.

FIG. 15 is a view depicting a second example of the floor plan of the joining plane 99 in the embodiment of the present technology.

In this second example of the floor plan, regions for copper wirings of a wiring use 93 are provided in a region surrounding the inner side of the input/output pads 98. Further, a region for the copper wiring of the wiring use 93, a region for copper wirings having a connection hole 92, and a region for a copper wiring of a shield use 94 are provided as regions of rectangular shapes on the inner side. In any other place, copper wirings of the dummy 91 are laid entirely.

In this second example of the floor plan, a region for a copper wiring of the shield use 94 is provided in a central region. This is useful, for example, as a countermeasure for preventing interference between the first semiconductor substrate 81 and the second semiconductor substrate 82.

Figure 16:
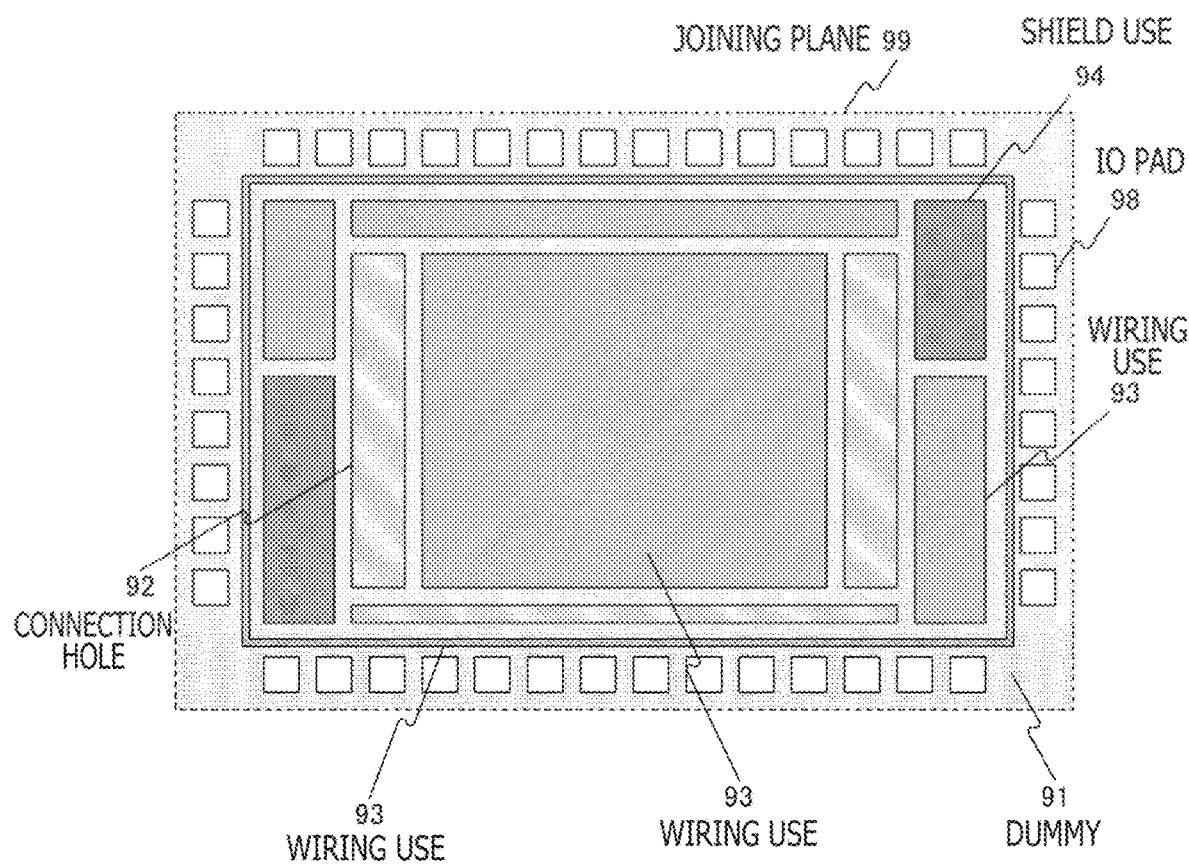
FIG. 16 is a view depicting a third example of the floor plan of the joining plane 99 in the embodiment of the present technology.

FIG. 16 is a view depicting a third example of the floor plan of the joining plane 99 in the embodiment of the present technology.

In this third example of the floor plan, a region for a copper wiring of the wiring use 93 is provided in a central region in comparison with the second example described hereinabove. This is useful, for example, in the case where a wiring of a wide area is provided between the first semiconductor substrate 81 and the second semiconductor substrate 82.

Figure 17:
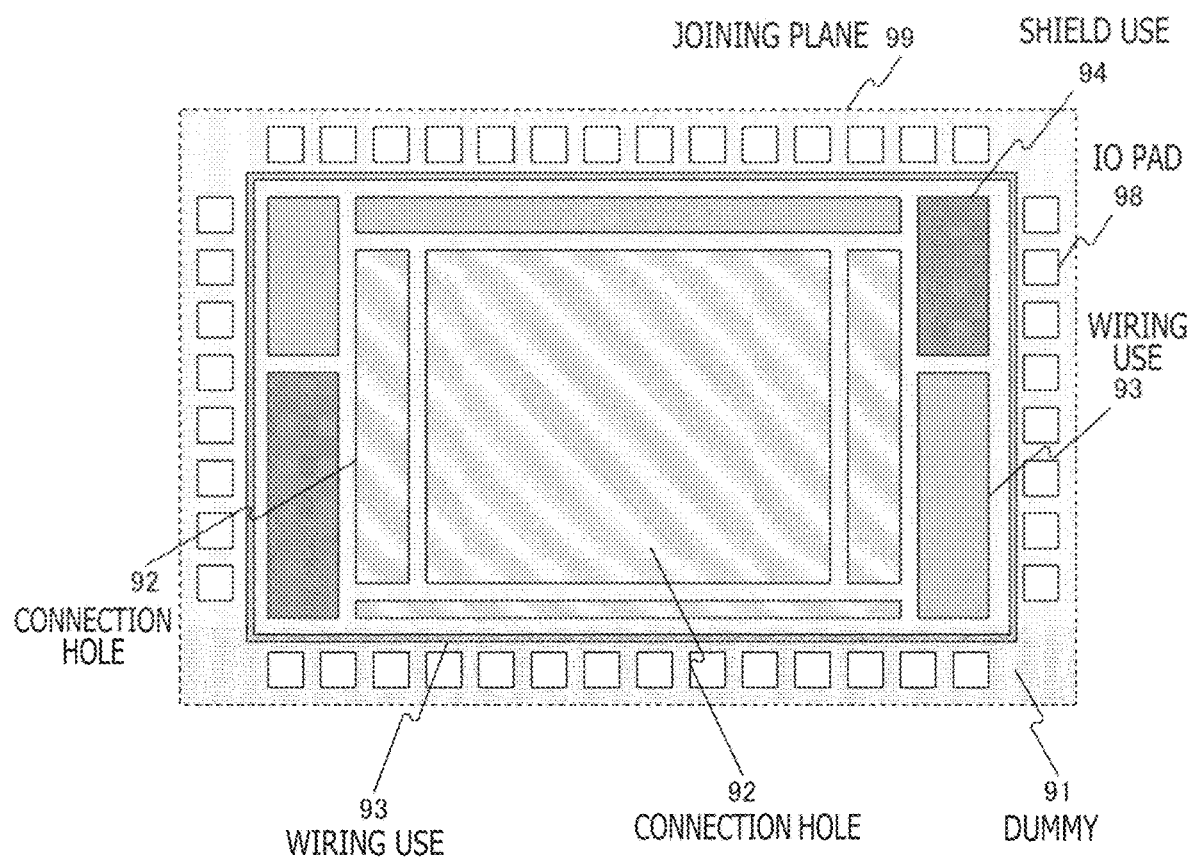
FIG. 17 is a view depicting a fourth example of the floor plan of the joining plane 99 in the embodiment of the present technology.

FIG. 17 is a view depicting a fourth example of the floor plan of the joining plane 99 in the embodiment of the present technology.

In this fourth example of the floor plan, a region for a copper wiring having a connection hole 92 in a central region is provided in comparison with the second example described hereinabove. This is useful, for example, in the case where a large amount of signal lines are provided between the pixel region 83 of the first semiconductor substrate 81 and the logic circuit 85 of the second semiconductor substrate 82.

Figure 18:
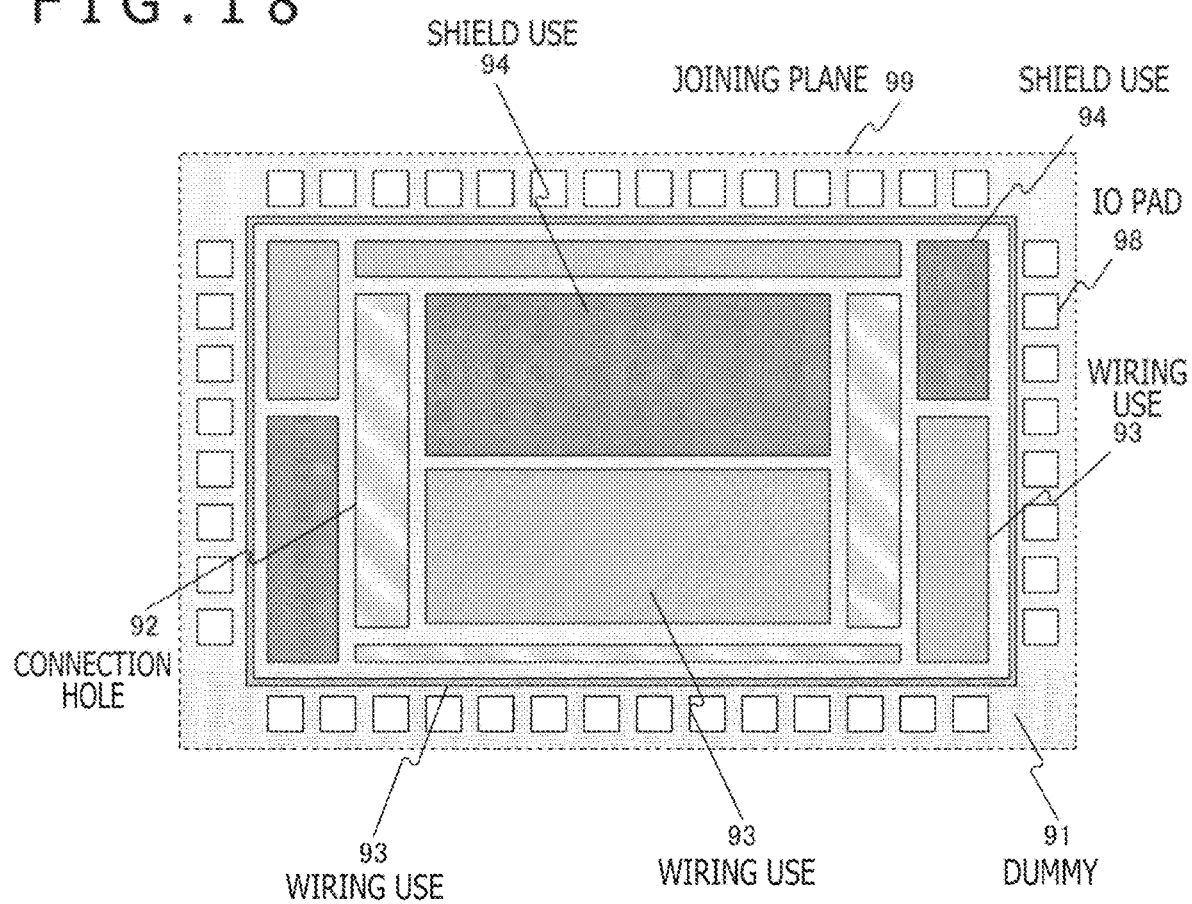
FIG. 18 is a view depicting a fifth example of the floor plan of the joining plane 99 in the embodiment of the present technology.

FIG. 18 is a view depicting a fifth example of the floor plan of the joining plane 99 in the embodiment of the present technology.

In this fifth example of the floor plan, a region for a copper wiring of the shield use 94 is provided in one half of a central region, and a region for a copper wiring of the wiring use 93 is provided in the other of the central region in comparison with the second example described above.

Figure 19:
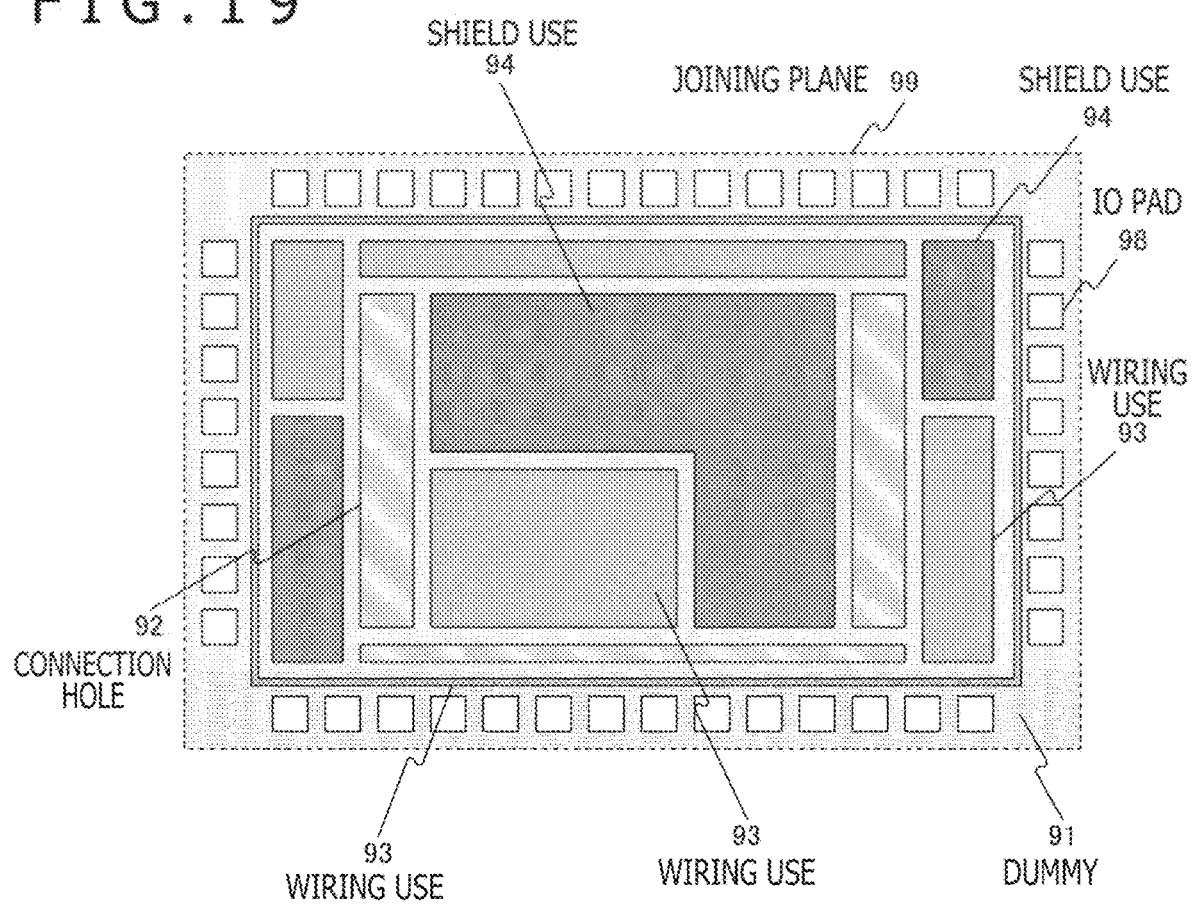
FIG. 19 is a view depicting a sixth example of the floor plan of the joining plane 99 in the embodiment of the present technology.

FIG. 19 is a view depicting a sixth example of the floor plan of the joining plane 99 in the embodiment of the present technology.

In this sixth example of the floor plan, a region for a copper wiring of the shield use 94 is provided in a central region wider than the region for a copper wiring of the wiring use 93 in comparison with the fifth example described above.

Figure 20:
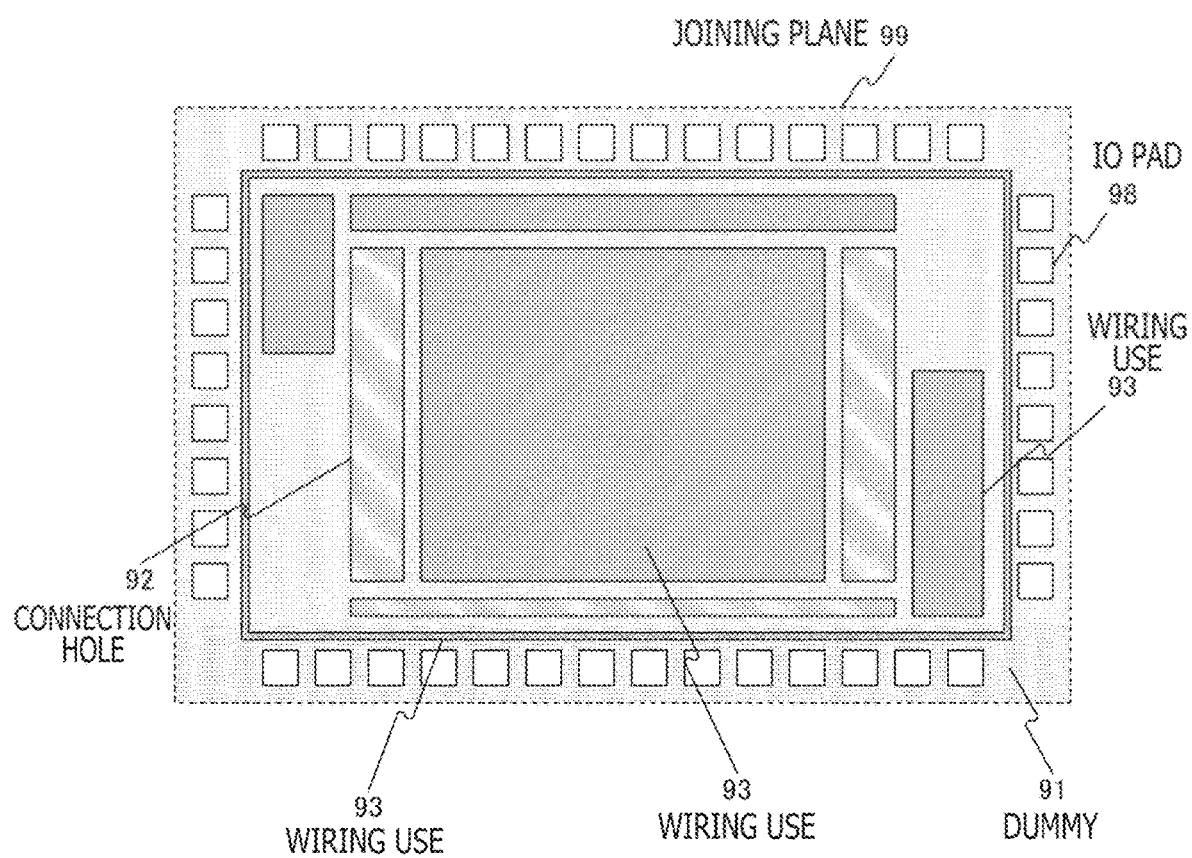
FIG. 20 is a view depicting a seventh example of the floor plan of the joining plane 99 in the embodiment of the present technology.

FIG. 20 is a view depicting a seventh example of the floor plan of the joining plane 99 in the embodiment of the present technology.

This seventh example of the floor plan is different in comparison with the third example described hereinabove in that it does not have a region for a copper wiring of the shield use 94.

In such a manner, the floor plan of the joining plane 99 can use arrangement for each use, and a combination, a size, and a quantity of them can be provided freely according to a use.

<4. Fabrication Process>
[Structure of Solid-State Imaging Device]

Figure 21:
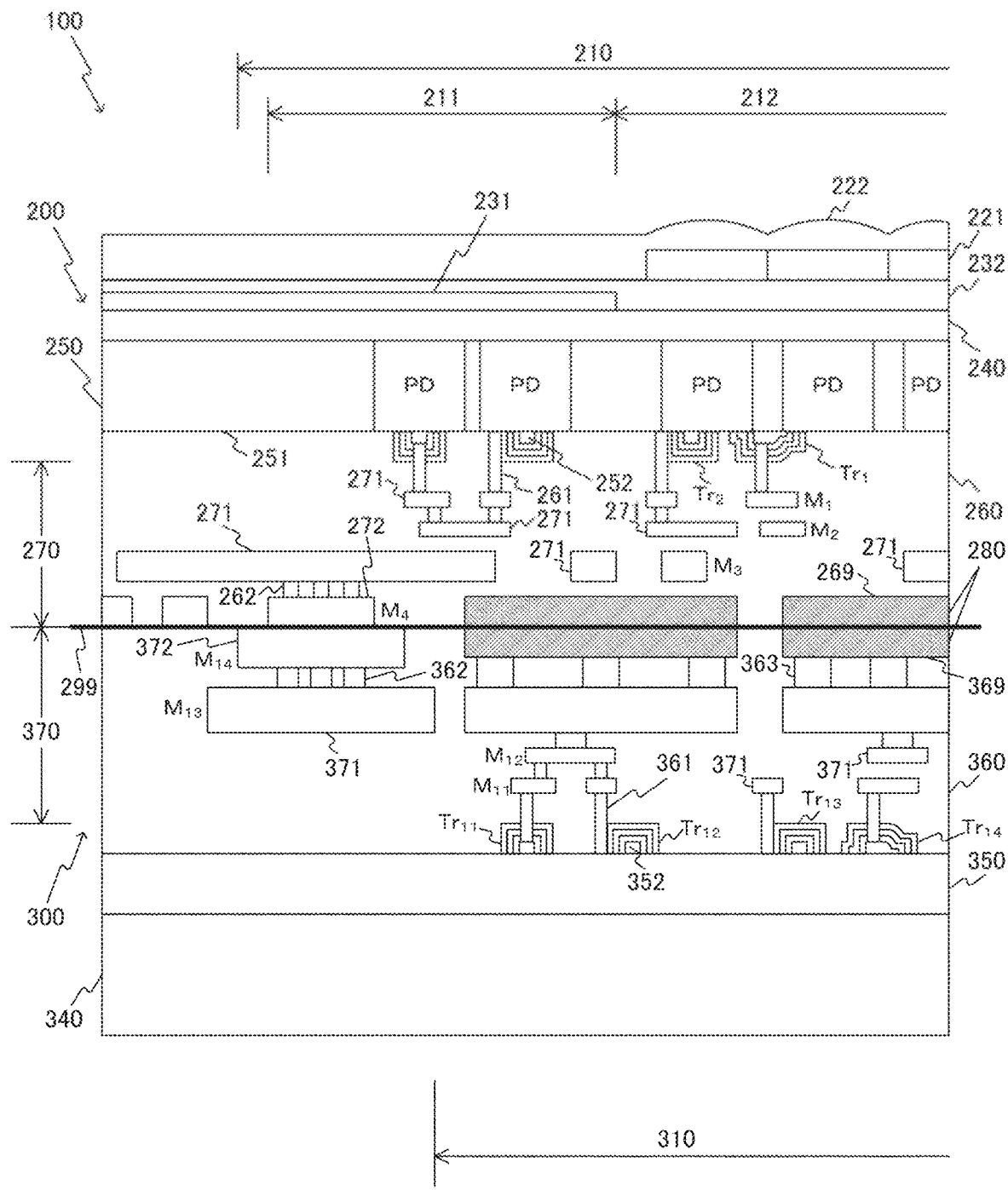
FIG. 21 is a sectional view depicting an example of a solid-state imaging device 100 in the embodiment of the present technology.

FIG. 21 is a sectional view depicting an example of the solid-state imaging device 100 in the embodiment of the present technology. The solid-state imaging device 100 is a CMOS solid-state imaging element of the back-illuminate type and has a light emitting portion arranged at an upper portion of a circuit section.

The solid-state imaging device 100 includes a stacked semiconductor chip in which a first semiconductor substrate 200 on which a pixel array and a control circuit are formed and a second semiconductor substrate 300 on which a logic circuit, an analog circuit and so forth are formed like the first semiconductor substrate 81 and the second semiconductor substrate 82 described hereinabove are pasted together. The first semiconductor substrate 200 and the second semiconductor substrate 300 are pasted together such that multilayer wiring layers of them are opposed to each other and besides connection wirings are joined together directly. It is to be noted that the first semiconductor substrate 200 and the second semiconductor substrate 300 are an example of a plurality of semiconductor substrates described in the claims.

In the first semiconductor substrate 200, a pixel array 210 in which a plurality of pixels each including a photodiode PD serving as a photoelectric conversion portion and a plurality of pixel transistors Tr1 and Tr2 is arrayed two-dimensionally in columns is formed on a semiconductor substrate 250 configured from silicon in the form of a thin film. It is to be noted here that the pixel transistors Tr1 and Tr2 are depicted representing a plurality of pixel transistors. Further, on the semiconductor substrate 250, a plurality of MOS transistors configuring a control circuit (not depicted) is formed.

On the surface 251 side of the semiconductor substrate 250, a multilayer wiring layer 270 on which wirings 271 (M1 to M3) and 272 (M4) of a plurality of layers, in the present example, four layers, of metals M1 to M4 are arranged is formed with an interlayer insulating film 260 interposed therebetween. For the wirings 271 and 272, a copper (Cu) wiring formed by a dual damascene method is used.

On the rear face side of the semiconductor substrate 250, a light-shielding film 231 is formed so as to include an optical black region 211 with an insulating film 240 interposed therebetween, and further, a color filter 221 and an on-chip lens 222 are formed on an effective pixel array 212 with a flattening film 232 interposed therebetween. Further, it is also possible to form the on-chip lens on the optical black region 211.

In the second semiconductor substrate 300, a logic circuit 310 configuring a peripheral circuit is formed on a semiconductor substrate 350. The logic circuit 310 includes a plurality of MOS transistors Tr11 to Tr14 including a CMOS transistor. Here, the MOS transistors Tr11 to Tr14 are depicted representing a plurality of MOS transistors of the logic circuit 310. Further, although an analog circuit is not depicted, it is formed on the semiconductor substrate 350.

In this example, a copper wiring 269 is formed on the first semiconductor substrate 200, and a copper wiring 369 is formed on the second semiconductor substrate 300. They are pasted together at the joining plane 299 and function as a joining plane wiring 280.

Figure 22:
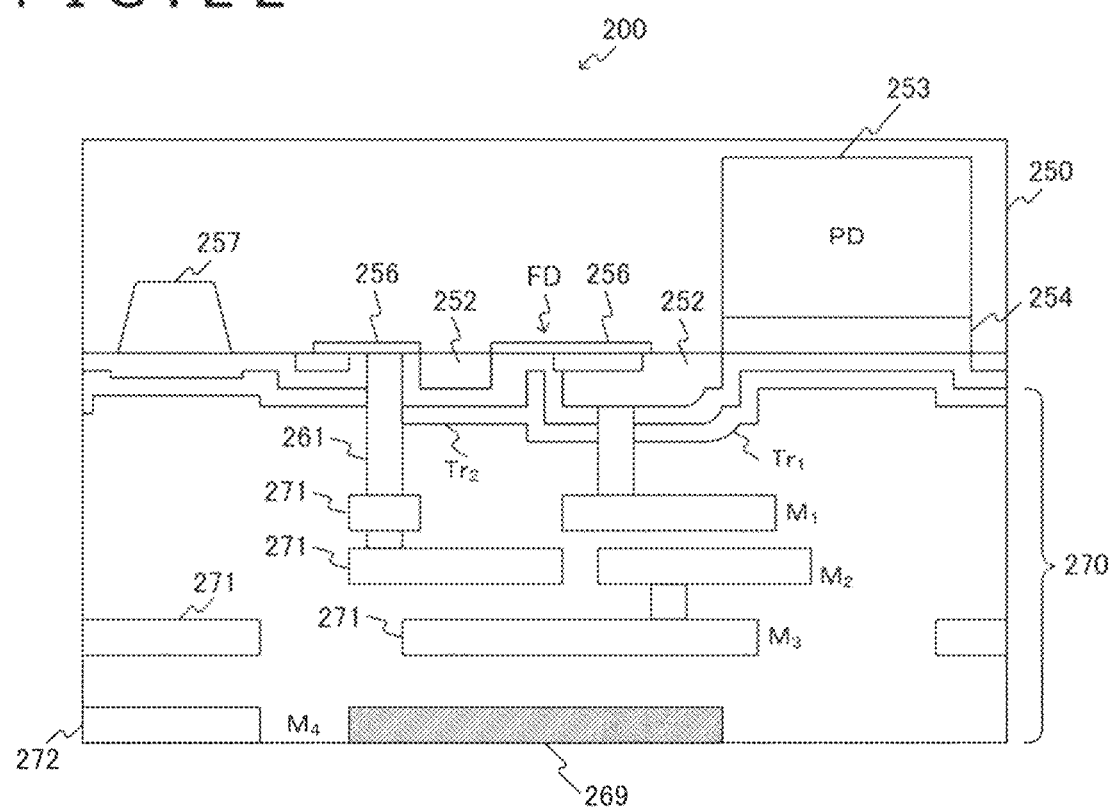
FIG. 22 is a view depicting an example of details of a first semiconductor substrate 200 in the embodiment of the present technology.

FIG. 22 is a view depicting an example of details of the first semiconductor substrate 200 in the embodiment of the present technology. In the first semiconductor substrate 200, a photodiode PD is formed on the semiconductor substrate 250 in the form of a thin film. The photodiode PD incudes, for example, an N-type semiconductor region 253 and a P-type semiconductor region 254 on the substrate surface side. On the substrate surface configuring the pixels, a gate electrode 252 is formed with a gate insulating film interposed therebetween, and the pixel transistors Tr1 and Tr2 are formed from the gate electrode 252 and paired source-drain regions 256.

The pixel transistor Tr1 adjacent to the photodiode PD corresponds to a floating diffusion FD. Each unit pixel is separated by an element isolation region 257. The element isolation region 257 is formed, for example, in an STI (Shallow Trench Isolation) structure in which an insulating film such as a silicon oxide film (SiO2 film) is embedded in a groove formed on the substrate.

In the multilayer wiring layer 270 of the first semiconductor substrate 200, a pixel transistor and a corresponding wiring 271 and an adjacent wiring 271 in upper and lower layers are connected to each other through individual conductive vias 261. Further, the connection wiring 269 by the metal M4 of the fourth layer is formed facing a joining plane 299 to the second semiconductor substrate 300. The connection wiring 269 is not connected to a required wiring 271 by the metal M3 of the third layer through the conductive via 261.

Figure 23:
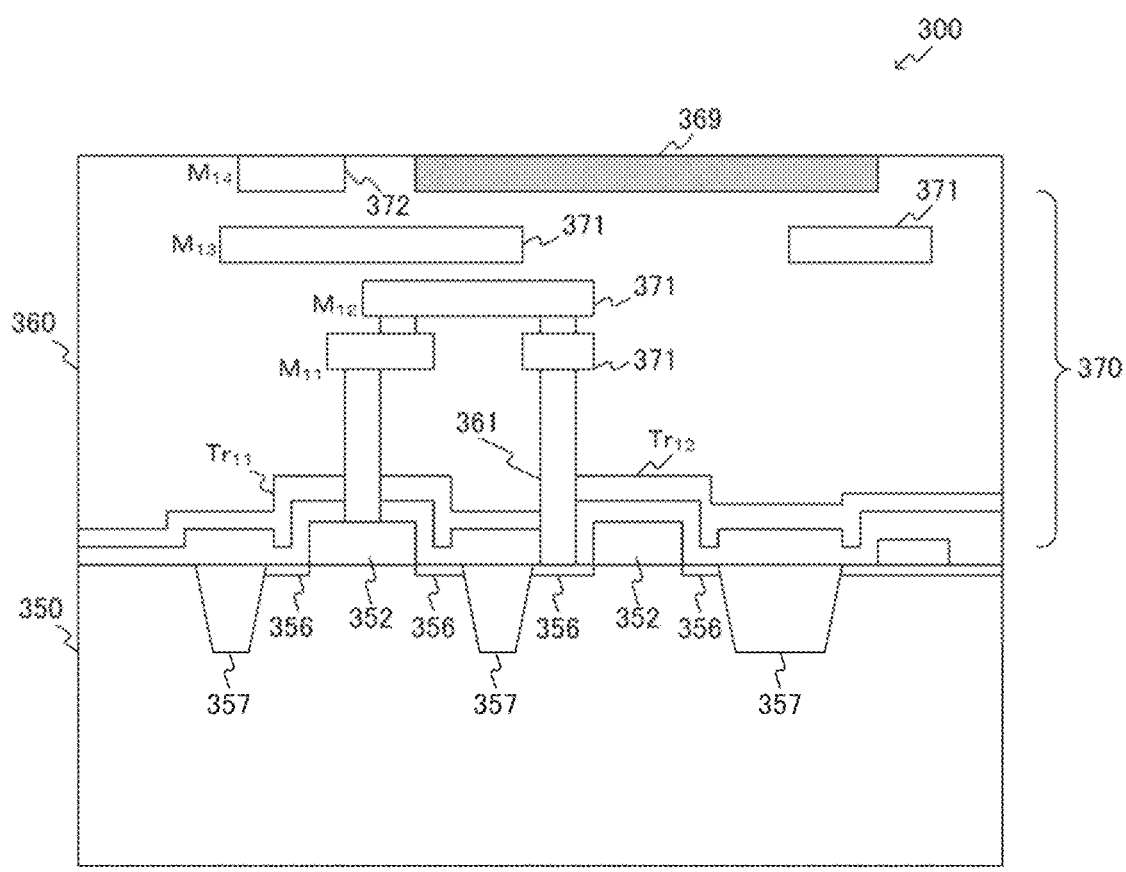
FIG. 23 is a view depicting an example of details of a second semiconductor substrate 300 in the embodiment of the present technology.

FIG. 23 is a view depicting an example of details of the second semiconductor substrate 300 in the embodiment of the present technology. In the second semiconductor substrate 300, a multilayer wiring layer 370 on which wirings 371 (M11 to M13) and 372 (M14) by metals M11 to M14 of a plurality of layers, in the present example, of four layers, are arranged is formed through an interlayer insulating film 360 on the surface of the semiconductor substrate 350. For the wirings 371 and 372, a copper (Cu) wiring by a dual damascene method is used.

In the second semiconductor substrate 300, the MOS transistors Tr11 and Tr12 are formed in a semiconductor well region on the surface side of the semiconductor substrate 350 such that they have a pair of source-drain regions 356 and have a gate electrode 352 with a gate insulating film interposed therebetween. The MOS transistors Tr11 and Tr12 are isolated, for example, by an element isolation region 357 of an STI structure.

In the multilayer wiring layer 370 of the second semiconductor substrate 300, connection is established between the MOS transistors Tr11 to Tr14 and the wirings 371 and between adjacent wirings 371 in upper and lower layers through a conductive via 361. Further, the connection wiring 369 by the metal M14 of the fourth layer is formed facing the joining plane 299 of the first semiconductor substrate 200. The connection wiring 369 is connected to a required wiring 371 by the metal M13 of the third layer through the conductive via 363.

The first semiconductor substrate 200 and the second semiconductor substrate 300 are electrically connected to each other by directly joining the connection wirings 272 and 372 facing the joining plane 299 such that the multilayer wiring layers 270 and 370 are opposed to each other. The interlayer insulating films 260 and 360 are formed by a combination of a Cu diffusion barrier insulating film for preventing Cu diffusion of a Cu wiring and an insulating film having no Cu diffusion barrier property as indicated by a fabrication method hereinafter described. Joining of the interlayer insulating films 260 and 360 other than the connection wirings 272 and 372 is performed by plasma joining or by a bonding agent. Further, direct joining portions of the connection wirings 272 and 372 by Cu wirings are coupled to each other by thermal diffusion.

In addition to the method of directly joining the connection wirings 272 and 372 facing the joining plane 299 to each other as described above, it is also possible to use a method of forming a very thin, uniform insulating thin film on the surfaces of the multilayer wiring layers 270 and 370 and joining them together by plasma joining or the like.

Then, in the embodiment of the present technology, especially in the proximity of the joining of the first semiconductor substrate 200 and the second semiconductor substrate 300, conductive films of a layer same as that of the connection wirings (connection wirings 269 and 369) are connected to form the joining plane wiring 280. The joining plane wiring 280 is connected to the wiring 371 in the metal M13 positioned on the second semiconductor substrate 300 through the connection hole 363 of a trench shape and has a wiring function of an equal potential. It is to be noted that the connection wirings 269 and 369 are an example of a conductor described in the claims.

[Power Supply Line]

Figure 24:
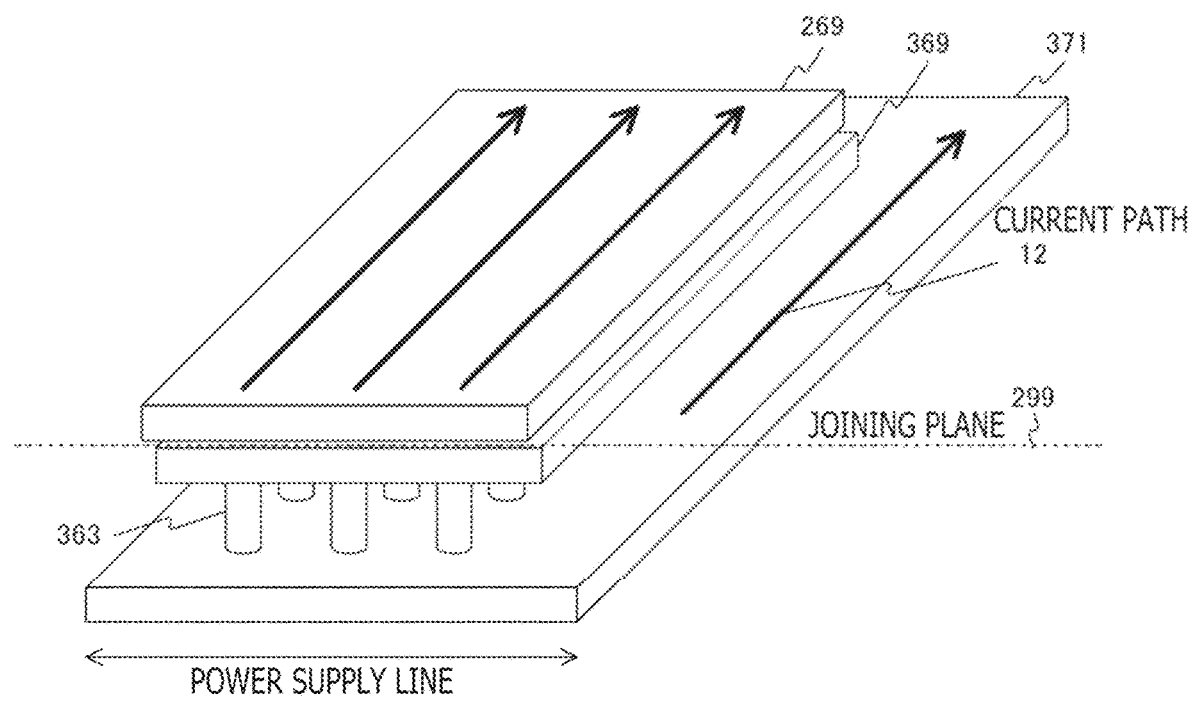
FIG. 24 is a view depicting a first example of arrangement of a connection hole 363 between a connection wiring 369 and a wiring 371 in the embodiment of the present technology.

FIG. 24 is a view depicting a first example of arrangement of the connection hole 363 between the connection wiring 369 and the wiring 371 in the embodiment of the present technology. Here, a structure in which a wiring on the joining plane is riveted to a power supply line of a thick width is assumed.

By this, the connection wirings 369 and 269 can pass current similarly to a current path 12 in the wiring 371 for power supply.

Figure 25:
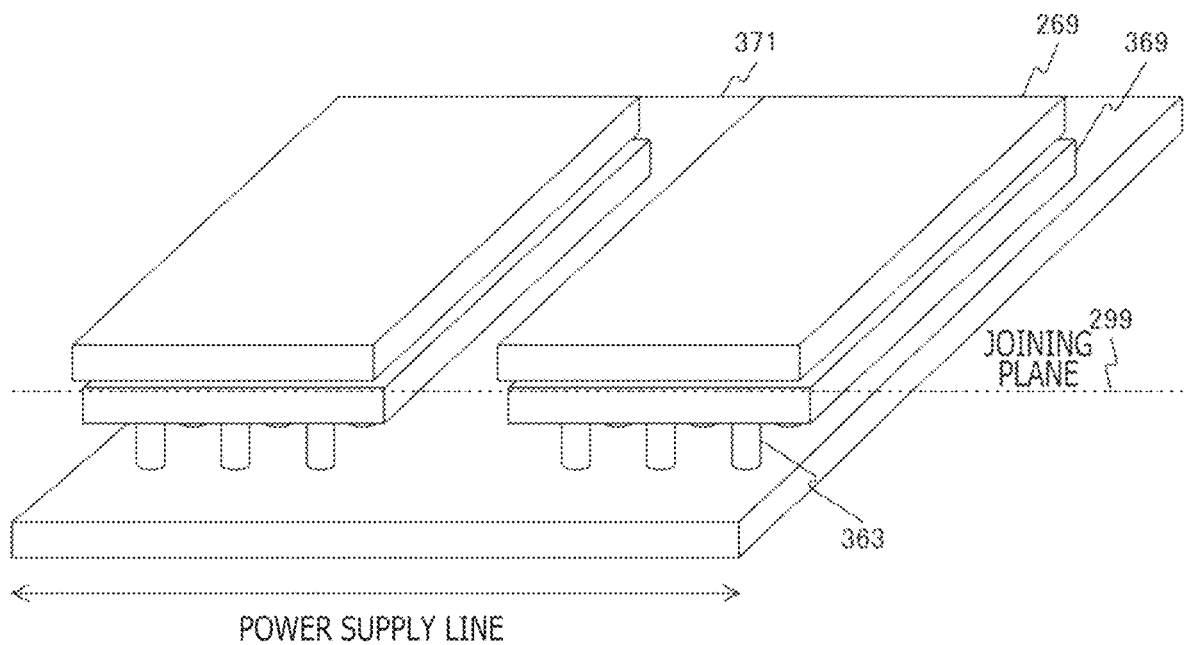
FIG. 25 is a view depicting a second example of arrangement of the connection hole 363 between the connection wiring 369 and the wiring 371 in the embodiment of the present technology.

FIG. 25 is a view depicting a second example of arrangement of the connection hole 363 between the connection wiring 369 and the wiring 371 in the embodiment of the present technology.

In this second example of arrangement, a plurality of connection wirings 369 and 269 is provided in the power supply line 371 of a thick width such that current can individually be applied to them.

[Fabrication Method of Solid-State Imaging Device]

FIGS. 26 to 33 are views depicting an example of a fabrication method of the solid-state imaging device in the embodiment of the present technology. It is to be noted that steps for the first semiconductor substrate 200 side having a pixel array and steps for the second semiconductor substrate 300 side having a logic circuit are omitted in the figures.

Figure 26:
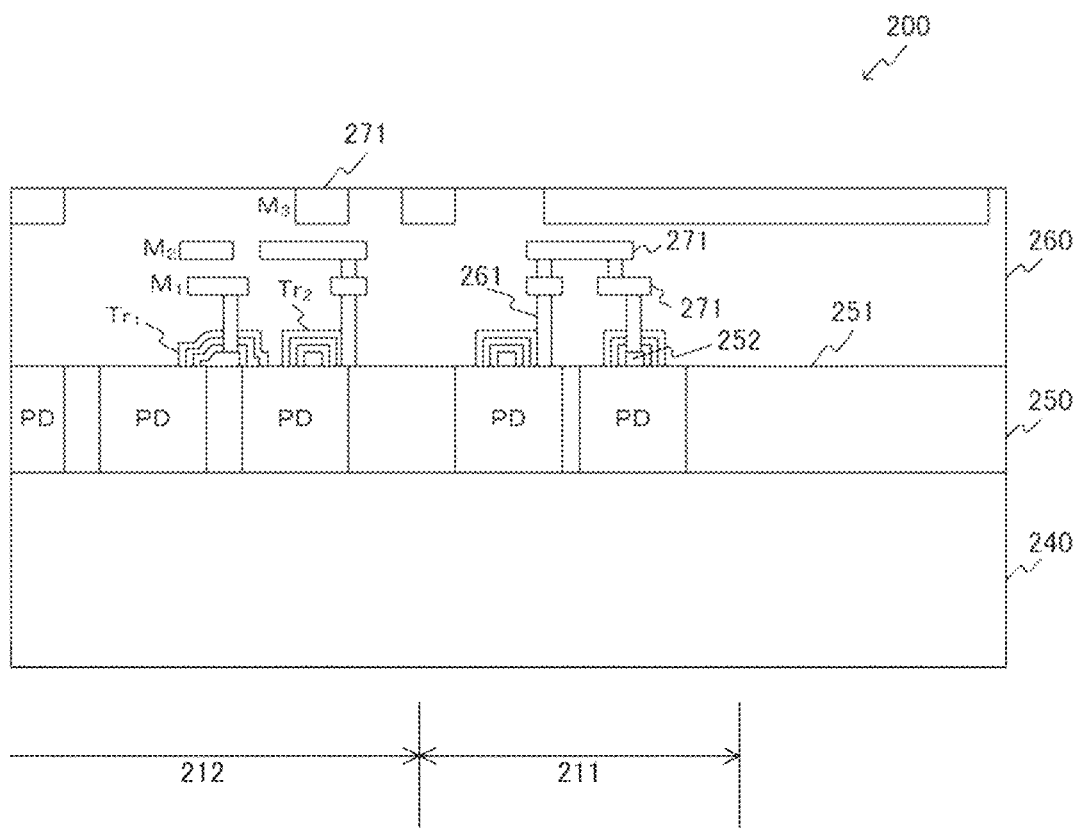
FIG. 26 is a view depicting a first step in an example of a fabrication method of the solid-state imaging device in the embodiment of the present technology.

First, as depicted in FIG. 26, a semiconductor well region is formed in a region that is to become each semiconductor chip portion of a semiconductor substrate 250, and a photodiode PD that is to become a photoelectric conversion portion of each pixel is formed in the semiconductor well region. The element isolation region 257 (not depicted) described hereinabove can be formed first. Each photodiode PD is formed such that it extends in the depthwise direction of the semiconductor well region. The photodiodes PD are formed in an effective pixel array 212 that configures a pixel array 210 and an optical black region 211.

Further, a plurality of pixel transistors configuring each pixel is formed on the surface 251 side of the semiconductor well region. The pixel transistors can include, for example, a transfer transistor, a reset transistor, an amplification transistor, and a selection transistor. Here, pixel transistors Tr1 and Tr2 are indicated as a representative as described hereinabove. Each of the pixel transistors Tr1 and Tr2 is formed such that it includes a pair of source/drain regions and a gate electrode through a gate insulating film.

At an upper portion of the semiconductor substrate 250 on the surface 251 side, wirings 271 by metals M1 to M3 of a plurality of layers, in the present example, of three layers, are formed including conductive vias 261 through an interlayer insulating film 260. The wirings 271 can be formed by a dual damascene method. In particular, after connection holes and wiring grooves by via first are formed simultaneously on the interlayer insulating film 260 and a Cu diffusion barrier metal film and a Cu seed film for preventing Cu diffusion are formed, a Cu material layer is embedded by a plating method. As the Cu diffusion barrier metal layer, for example, Ta, TaN, Ti, TiN, W, WN, Ru, TiZrN, and an alloy layer containing them are listed.

Then, a surplus Cu material layer is removed by a CMP (chemical mechanical polishing) method to form Cu wirings integrated with the flattened conductive vias. Thereafter, a Cu diffusion barrier insulating film not depicted is formed. As the Cu diffusion barrier insulating film, for example, insulating films of SiN, SiC, siCN, SiON and so forth can be used. This step is repeated to form wirings 271 by metals M1 to M3 of three layers.

Figure 27:
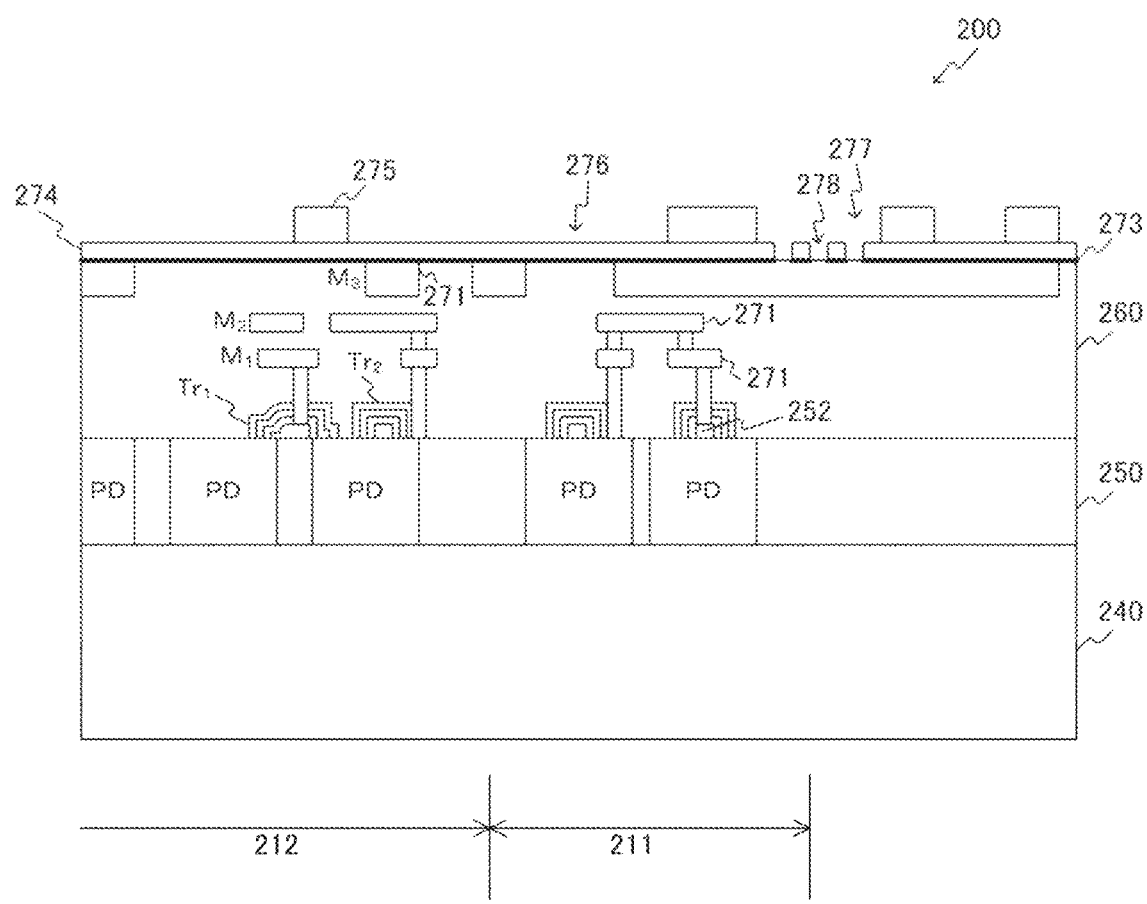
FIG. 27 is a view depicting a second step in the example of the fabrication method of the solid-state imaging device in the embodiment of the present technology.

Then, as depicted in FIG. 27, a Cu diffusion barrier insulating film 273, a first insulating film 274 having no Cu diffusion barrier property, and a second insulating film 275 having no Cu diffusion barrier property are formed in order. The first insulating film 274 and the second insulating film 275 are formed from a SiO2 film, a SiCOH film or the like. Further, as the Cu diffusion barrier insulating film 273, for example, insulating films of SiN, SiC, SiCN, SiON and so forth can be used similarly as described above. The Cu diffusion barrier insulating film 273, the first insulating film 274, and the second insulating film 275 correspond to the interlayer insulating film 260.

Then, the second insulating film 275, the first insulating film 274, and the Cu diffusion barrier insulating film 273 are patterned by via first using lithography and etching technologies to selectively open via holes 278. Thereafter, the second insulating film 275 portion is patterned to selectively form openings 277. In particular, the second insulating film 275 portion is patterned so as to have the openings 276 at portions corresponding to connection wirings 269 to be formed, openings 277 at portions corresponding to connection wirings 272 to be formed, and via holes 278.

Figure 28:
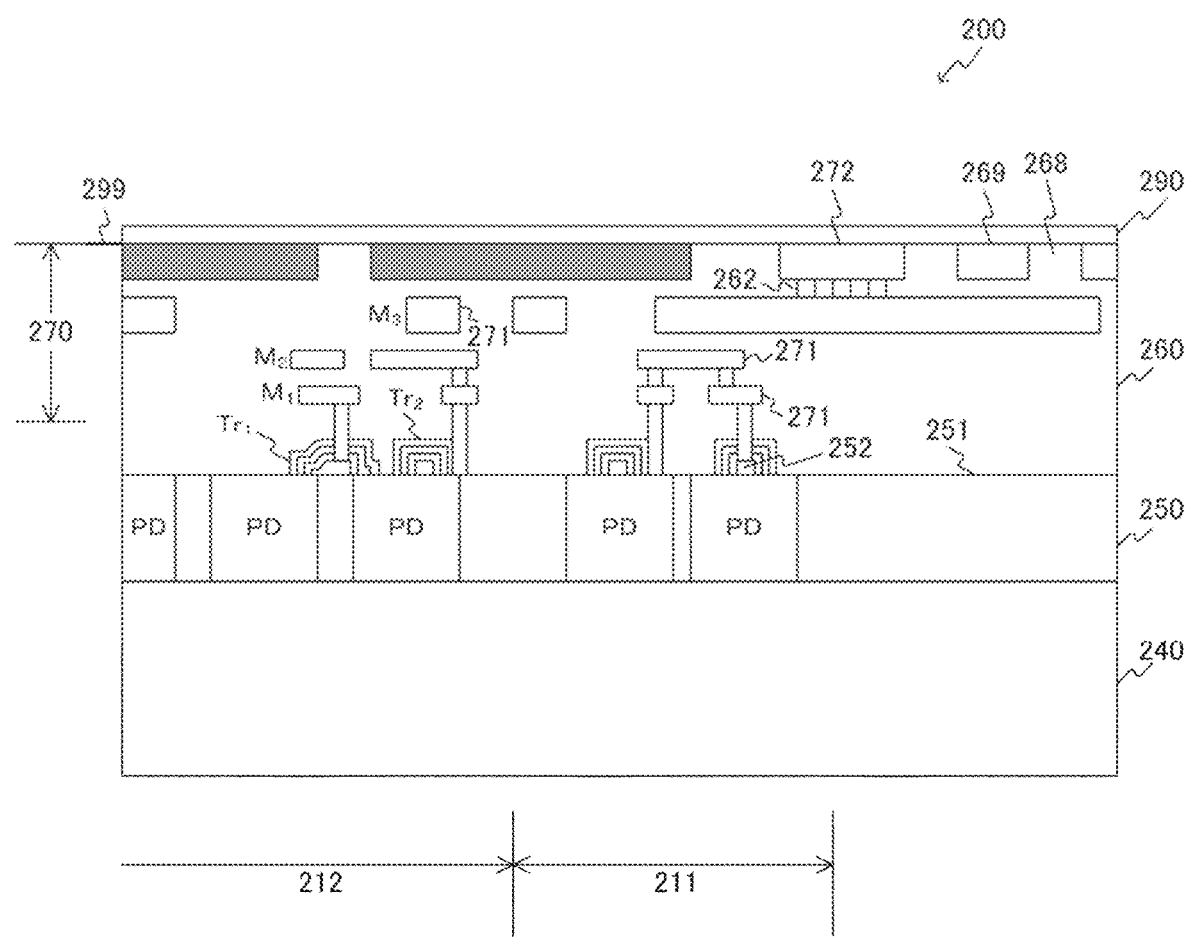
FIG. 28 is a view depicting a third step in the example of the fabrication method of the solid-state imaging device in the embodiment of the present technology.

Then, as depicted in FIG. 28, Cu material is embedded into the openings 276 and 277 and the via holes 278 by using a dual damascene method similarly as described above to form shielding portions (connection wirings 269) having openings 268 and conductive vias 262 and connection wirings 272 connecting to the wirings 271. The shielding portions (connection wirings 269) and the connection wirings 272 are formed from the metal M4 of the fourth layer. By this, the wirings 271, the connection wirings 272, the connection wirings 269, and the interlayer insulating film 260 by the metals M1 to M4 are formed. Further, a very thin uniform insulating thin film 290 is formed at an upper portion of the multilayer wiring layer 270.

Figure 29:
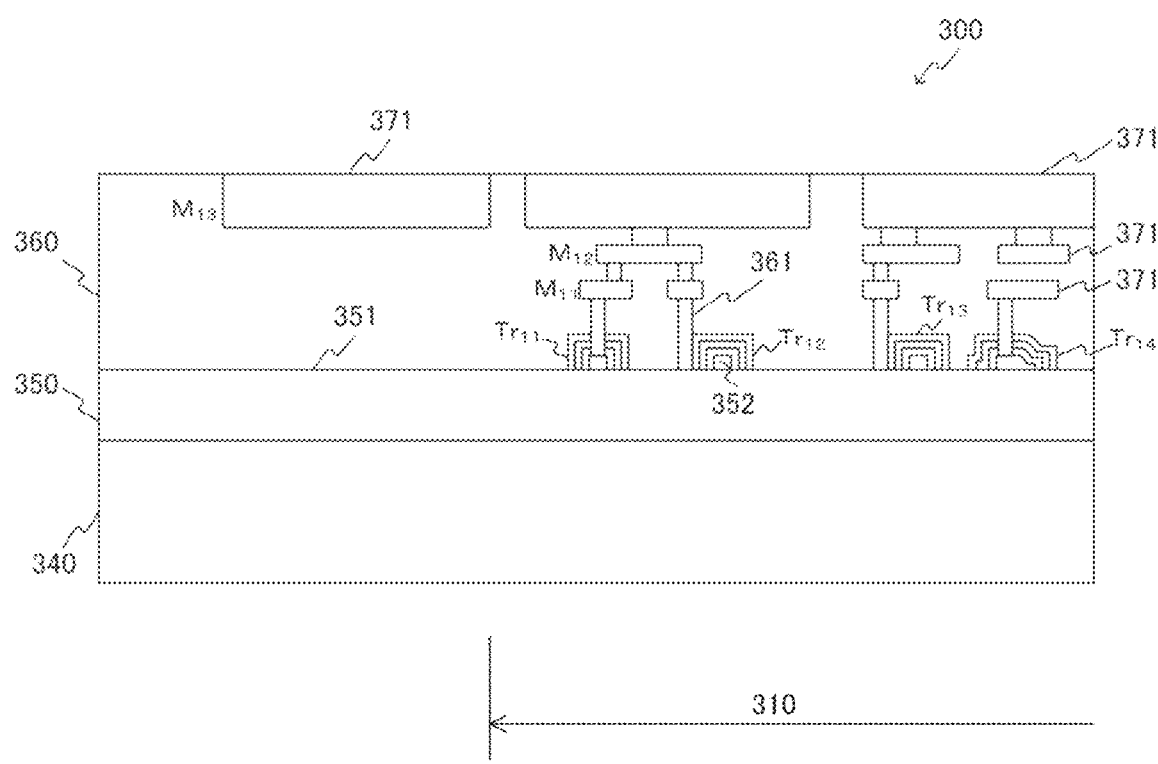
FIG. 29 is a view depicting a fourth step in the example of the fabrication method of the solid-state imaging device in the embodiment of the present technology.

On the other hand, as depicted in FIG. 29, a semiconductor well region is formed in a region that is to become each semiconductor chip portion of the semiconductor substrate 350. A plurality of MOS transistors Tr11 to Tr14 configuring a logic circuit 310 is formed in this semiconductor well region. Here, the MOS transistors Tr11 to Tr14 are depicted as a representative as described hereinabove. The element isolation region 357 (not depicted) described hereinabove can be formed first.

At an upper portion on the surface 351 side of the semiconductor substrate 350, wirings 371 by metals M11 to M13 of a plurality of layers, in the present example, of three layers, are formed including conductive vias 361 through an interlayer insulating film 360. The wirings 371 can be formed by a dual damascene method. In particular, connection holes and wiring grooves by via first are formed simultaneously in the interlayer insulating film and a Cu diffusion barrier metal film and a Cu seed film for preventing Cu diffusion are formed, whereafter a Cu material layer is embedded by a plating method. As the Cu diffusion barrier metal film, for example, Ta, TaN, Ti, TiN, W, WN, Ru, TiZrN, and an alloy film containing them are listed. Then, a surplus Cu material layer is removed by a CMP (chemical mechanical polishing) method to form Cu wirings integrated with the flattened conductive vias. Thereafter, a Cu diffusion barrier insulating film (not depicted) is formed. As the Cu diffusion barrier insulating film, for example, insulating films of SiN, SiC, SiCN, SiON and so forth can be used. This step is repeated to form wirings 371 by the metals M11 to M13 of three layers.

Figure 30:
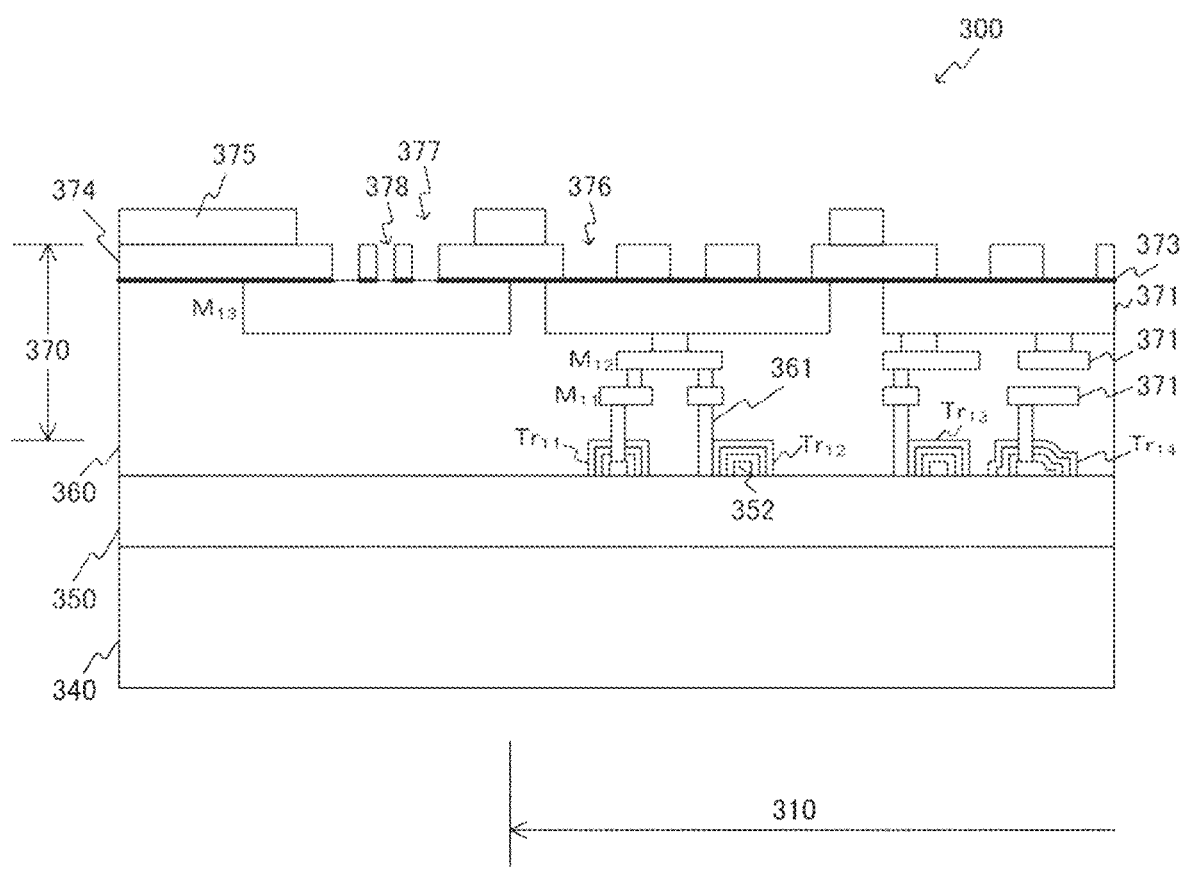
FIG. 30 is a view depicting a fifth step in the example of the fabrication method of the solid-state imaging device in the embodiment of the present technology.

Then, as depicted in FIG. 30, a Cu diffusion barrier insulating film 373, a first insulating film 374 having no Cu diffusion barrier property, and a second insulating film 375 having no Cu diffusion barrier property are formed sequentially. The first insulating film 374 and the second insulating film 375 are formed from a SiO2 film, a SiCOH film or the like. Further, as the Cu diffusion barrier insulating film 373, for example, insulating films of SiN, SiC, SiCN, SiON and so forth can be used, similarly as described above. The Cu diffusion barrier insulating film 373, the first insulating film 374, and the second insulating film 375 correspond to an interlayer insulating film. Then, the second insulating film 375, the first insulating film 374, and the Cu diffusion barrier insulating film 373 are patterned by via first using lithography and etching technologies to selectively open via holes 378. Thereafter, the second insulating film 375 portion is patterned to selectively form openings 376 and 377.

Figure 31:
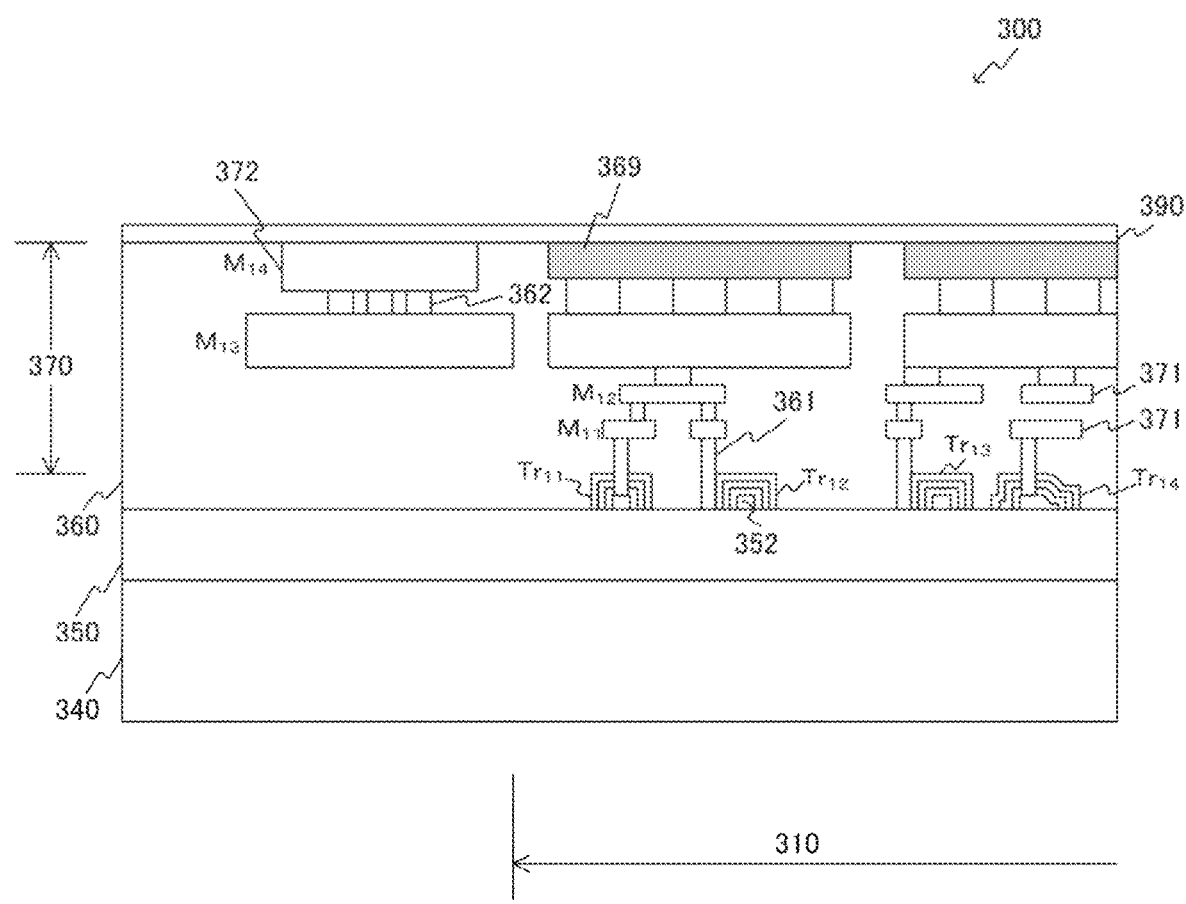
FIG. 31 is a view depicting a sixth step in the example of the fabrication method of the solid-state imaging device in the embodiment of the present technology.

Then, as depicted in FIG. 31, Cu material is embedded into the openings 376 and 377 and the via holes 378 similarly as described above using a dual damascene method to form connection wirings 369, conductive vias 361 connecting to the wirings 371, and connection wirings 372. The connection wirings 369 and the connection wirings 372 are formed from the metal M14 of the fourth layer. By this, a multilayer wiring layer 370 is formed from the wirings 371, the connection wirings 372, the connection wirings 369, and the interlayer insulating film 360 by the metals M11 to M13. Further, a very thin uniform insulating thin film 390 is formed on an upper portion of the multilayer wiring layer 370.

Figure 32:
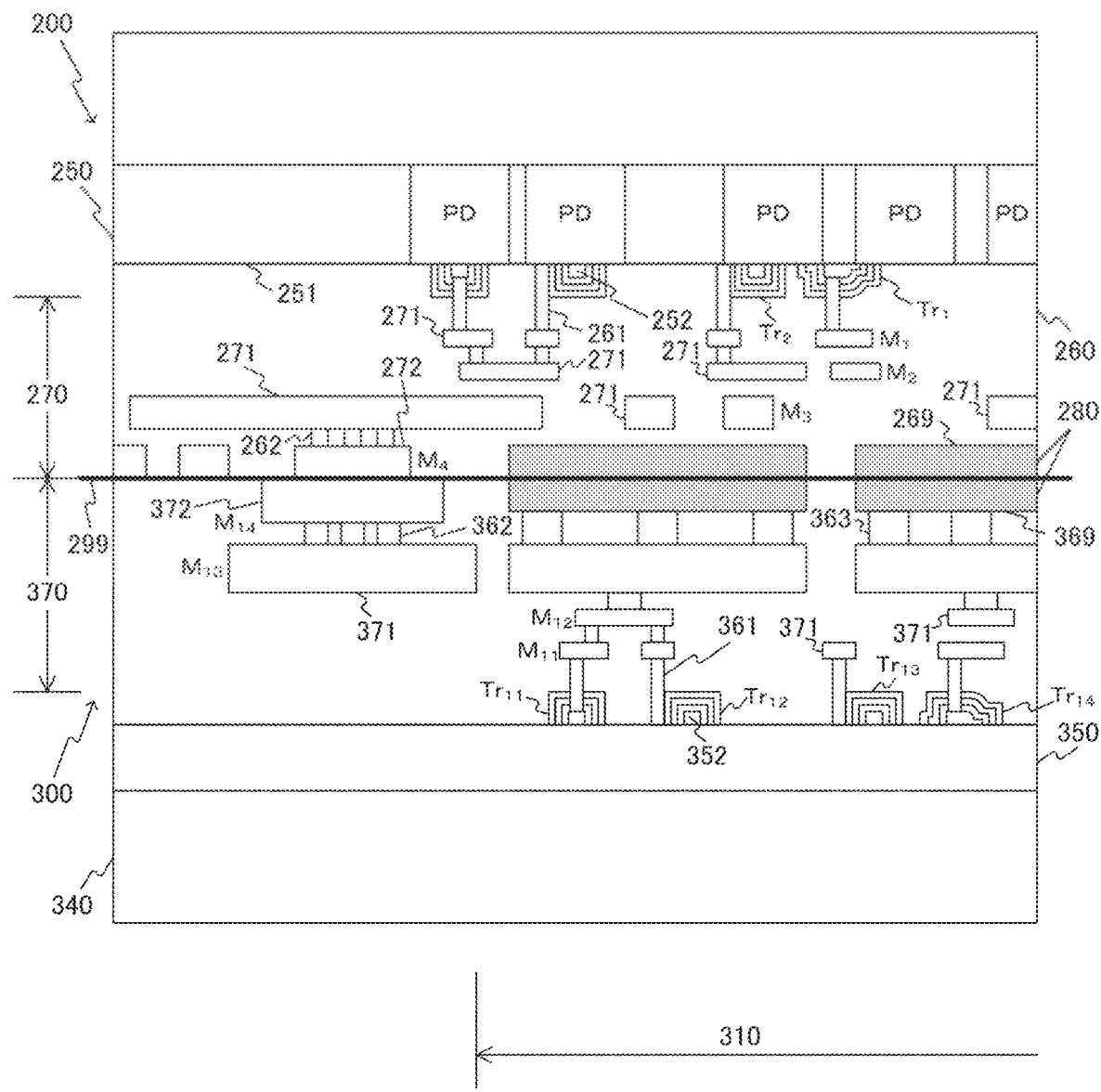
FIG. 32 is a view depicting a seventh step in the example of the fabrication method of the solid-state imaging device in the embodiment of the present technology.

Then, as depicted in FIG. 32, the first semiconductor substrate 200 and the second semiconductor substrate 300 are joined together such that the multilayer wiring layers of them are opposed to each other and the connection wirings 272 and 372 of them directly contact with each other to establish electric connection between them. In short, the first semiconductor substrate 200 and the second semiconductor substrate 300 are physically joined together and electrically connected to each other. At this time, the connection wirings 269 and the connection wirings 369 are also directly joined together at overlapping portions of them. In particular, the connection wirings 272 and 372 and the connection wirings 269 and 369 are individually connected to each other by thermal diffusion joining. The heat processing temperature at this time can approximately be 100° C. to 500° C. Further, the insulating films that are interlayer insulating films are plasma joined together by performing surface processing. It is to be noted that it is also possible to join the insulating films that are interlayer insulating films together by a bonding agent.

In such a manner, since the first conductor of the connection wiring 269 and the second conductor of the connection wiring 369 can be connected to each other by placing an insulating film on the joining plane 299 first and then applying heat to cause crystal growth of copper that is a conductor, they are electrically connected to each other in the proximity of the joining plane 299. Accordingly, the first conductor and the second conductor are arranged on the joining plane 299 side with respect to the logic circuit 310 and the wirings 271 formed on the first semiconductor substrate 200 and the second semiconductor substrate 300, respectively.

Figure 33:
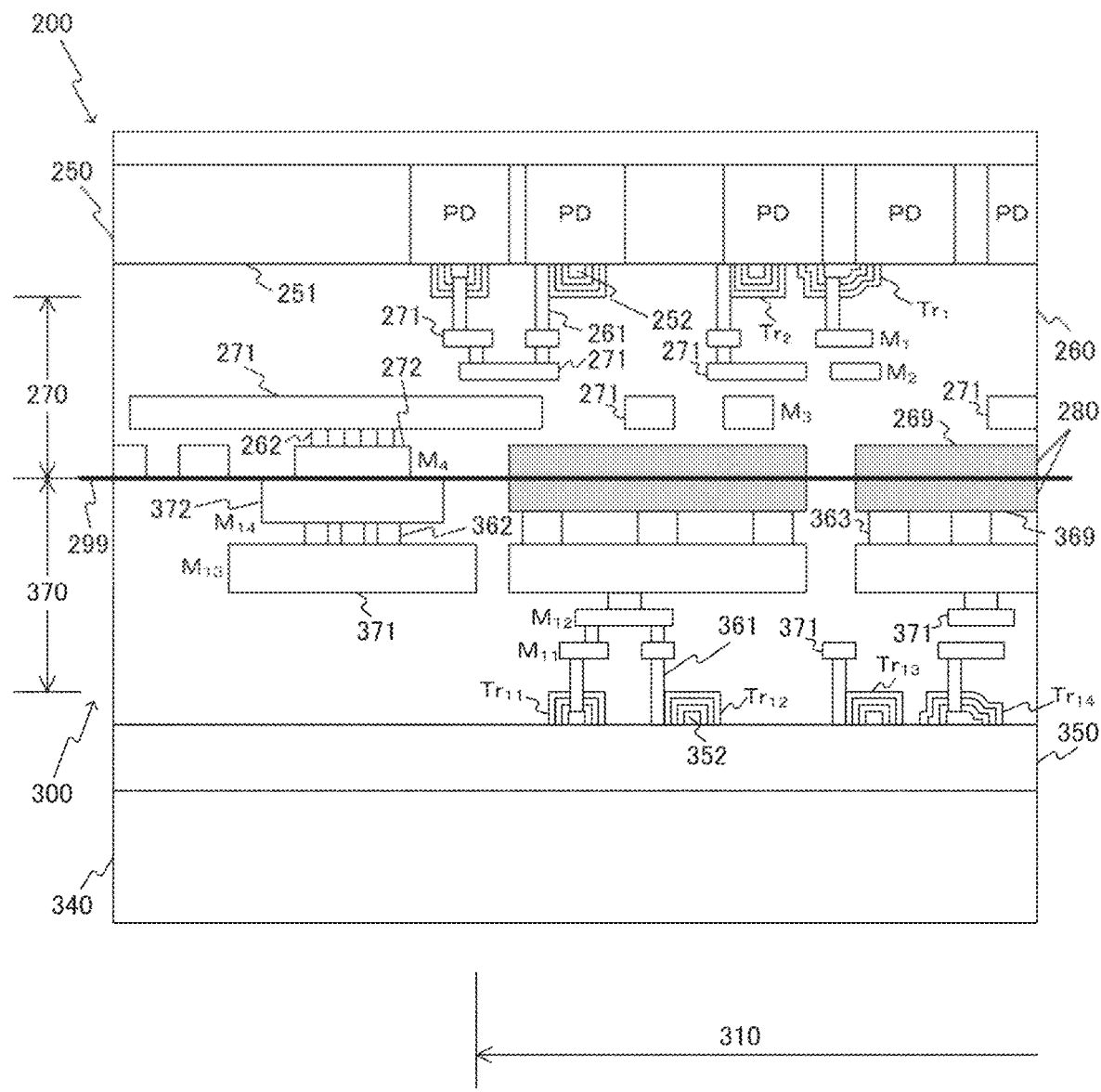
FIG. 33 is a view depicting an eighth step in the example of the fabrication method of the solid-state imaging device in the embodiment of the present technology.

Then, as depicted in FIG. 33, the semiconductor substrate 250 is ground and polished using a CMP method or the like to reduce the thickness such that a necessary film thickness of the photodiode PD from the rear face side remains.

Thereafter, a light-shielding film 231 is formed on the surface of the thin film including photodiodes PD corresponding to an optical black region through an insulating film 240. Further, color filters 221 and on-chip lenses 222 are formed on the photodiodes PD corresponding to the effective pixel array with a flattening film 232 interposed therebetween.

By this, as depicted in FIG. 21 described hereinabove, semiconductor chipping of separating the first semiconductor substrate 200 and the second semiconductor substrate 300 joined together into individual semiconductor chips is performed to thereby obtain a solid-state imaging device 100.

Here, as the conductive layer (connection wirings 269 and 369) configuring the joining plane wirings 280, connection wirings 272 and 372, and metals M4 and M14 of wirings of layers same as those of them, a single material or an alloy of Al, W, Ti, Ta, Mo, Ru and so forth can be used in addition to Cu.

It is to be noted that, although, in this example, the description is given assuming the shape of a copper wiring of a of FIG. 5, another shape may be adopted.

[Modification]

Although, in the embodiment described above, the first semiconductor substrate 81 and the second semiconductor substrate 82 are stacked, a further semiconductor substrate may be stacked.

Figure 34:
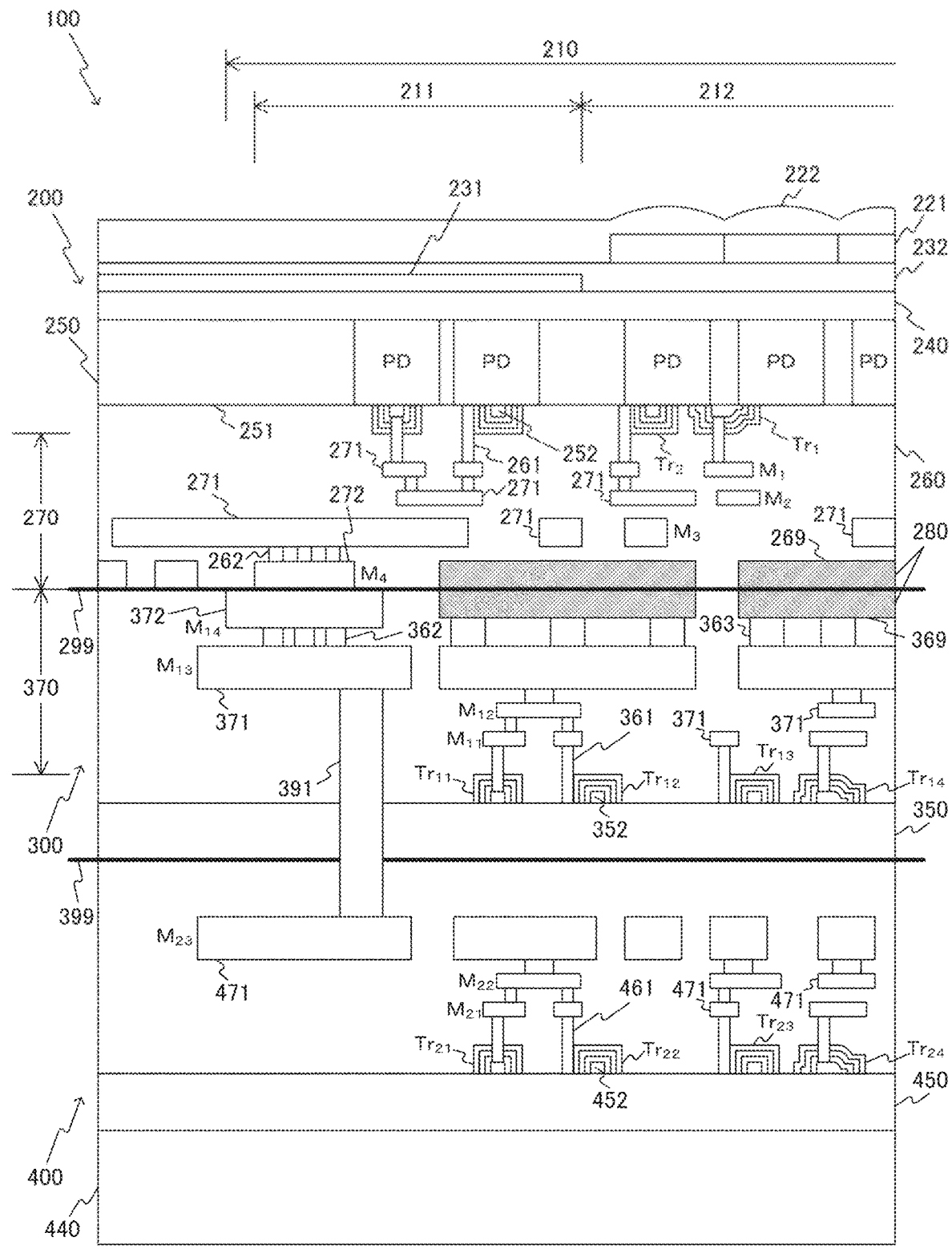
FIG. 34 is a sectional view depicting an example of a solid-state imaging device 100 according to a modification of the embodiment of the present technology.

FIG. 34 is a sectional view depicting an example of the solid-state imaging device 100 according to a modification of the embodiment of the present technology.

In this modification, a third semiconductor substrate 400 is further stacked on the lower side of the first semiconductor substrate 200 and the second semiconductor substrate 300. By stacking three layers of semiconductor substrates, it is possible to achieve high performance or reduction of the chip size of an image sensor by stacking substrates having various functions. It is to be noted that the number of stacked layers of semiconductor substrates of the solid-state imaging element according to the present technology is not limited to three or less and may be equal to or greater than four.

<5. Example of Application to Power Supply Wiring>
[Reinforcement of Analog Power Supply]

Figure 35:
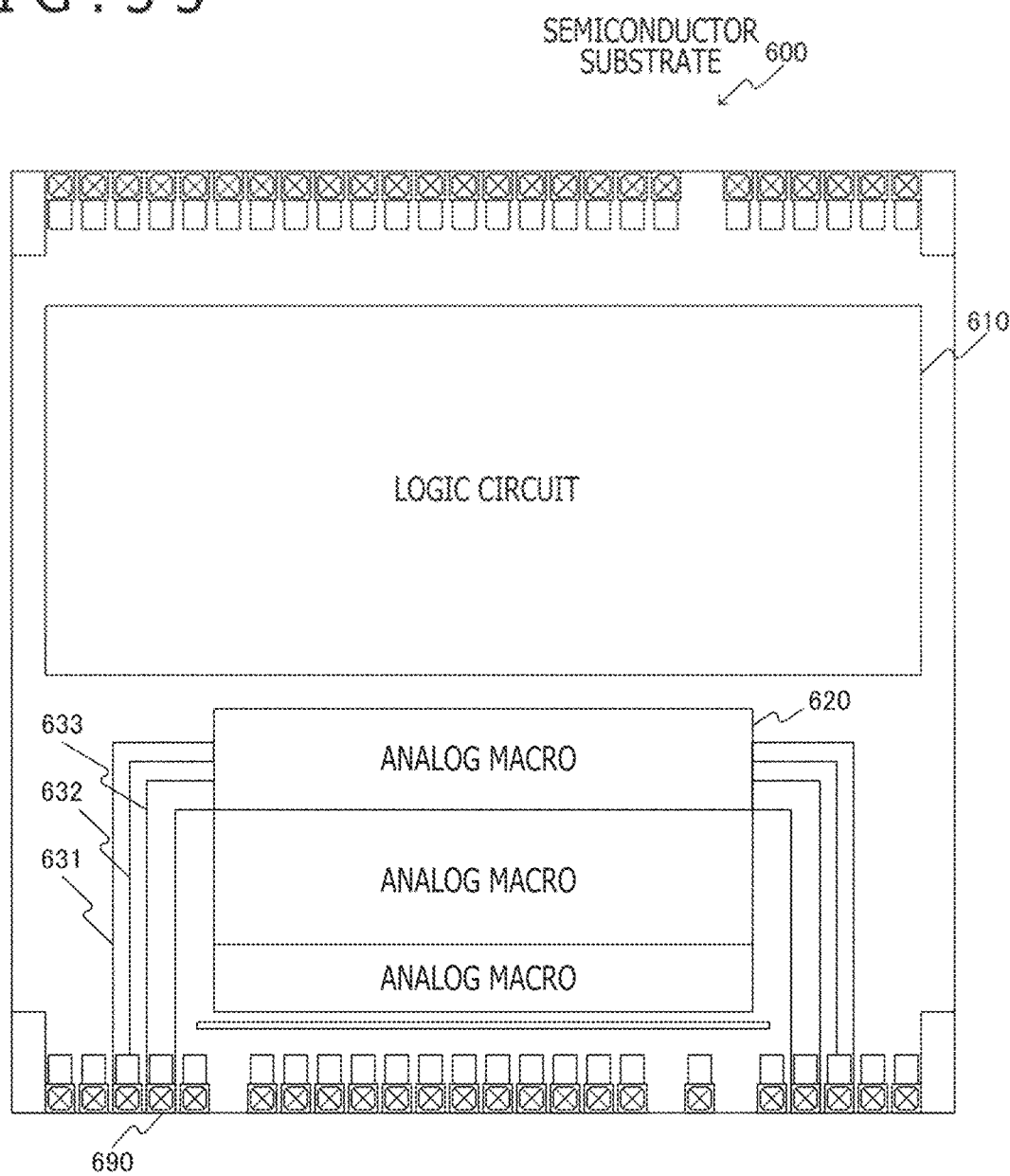

FIG. 35 is a view depicting an example of a floor plan of a semiconductor substrate 600 in the embodiment of the present technology. This example applies wiring use of a conductor, here, of copper, in the proximity of the joining plane as a power supply wiring for an analog circuit.

In this example, the semiconductor substrate 600 includes, in addition to a logic circuit 610, an analog macro 620 connecting to input/output pads 690 on the periphery of the semiconductor substrate 600. By lining wiring uses 633 in parallel in addition to ordinary power supply wirings 631 and 632 between the analog macro 620 and the input/output pad 690, reduction of the wiring resistance is achieved.

Here, the power supply wiring 632 is an uppermost layer of ordinary metal layers, and the power supply wiring 631 is a layer lower by one layer than the power supply wiring 632. By connecting the power supply wiring 632 and the power supply wiring 631 by riveting and using them, reinforcement of the power supply is achieved. In this embodiment, by connecting the wiring use 633 by riveting in an upper layer than the power supply wiring 632 of the uppermost layer metal, the resistance can be reduced by using three or more wiring layers.

Further, it is possible to connect two layers, i.e., the wiring use 633 and the power supply wiring 632 of the uppermost layer metal, by riveting to suppress the resistance. Further, it is possible to reduce the number of wiring layers and achieve reduction of the cost by using only the wiring use 633 as an analog power supply.

Figure 36:
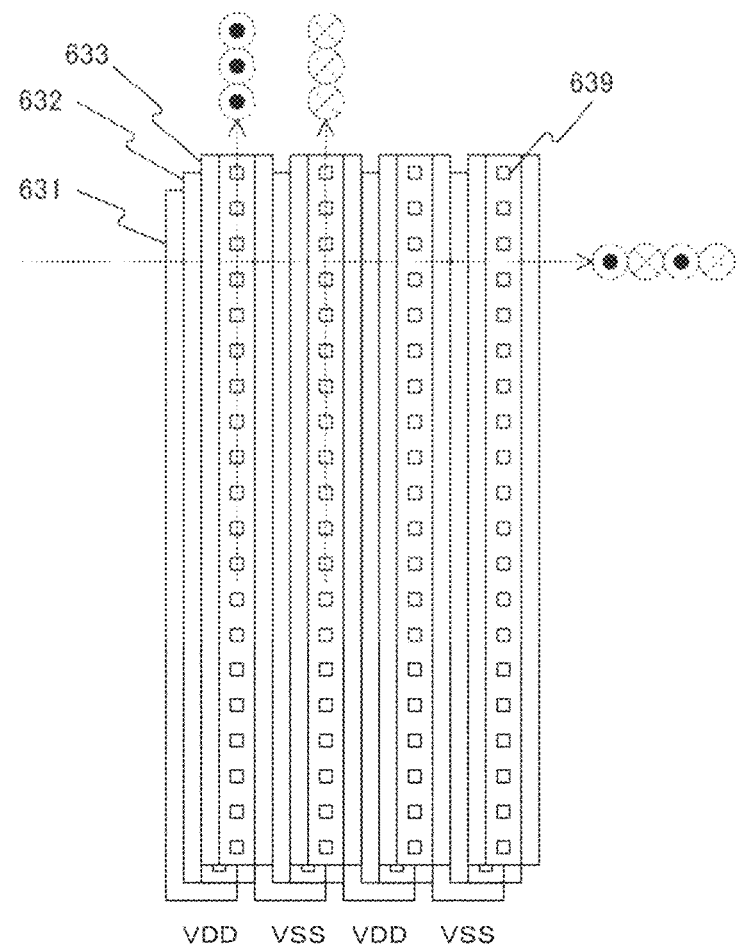
FIG. 36 is a view depicting an example of a floor plan in a semiconductor substrate 600 in the embodiment of the present technology.

FIG. 36 is a view depicting a first example of arrangement of a power supply wiring in the embodiment of the present technology.

In FIG. 36, the VDD power supply indicated by a mark "•" indicates that current flows towards the front in FIG. 36 while the VSS power supply indicated by a mark "x" indicates that current flows toward the interior side in FIG. 36. In this example, only one of VDD power supplies or VSS power supplies is wired in a vertical direction. In this case, although the VDD power supply and the VSS power supply are arranged alternately in the horizontal direction in FIG. 36, in the vertical direction, only power supply lines of only one of the power supplies are provided. Therefore, there is the possibility that noise may be caused by a change of induced electromotive force generated in conductor loops formed in the pixel region 83 of the first semiconductor substrate 81 by an influence of a magnetic field generated by current and may possibly have an influence on the picture quality. Accordingly, it is desirable to lay out the wirings taking the influence of a magnetic field into consideration as described below.

Figure 37:
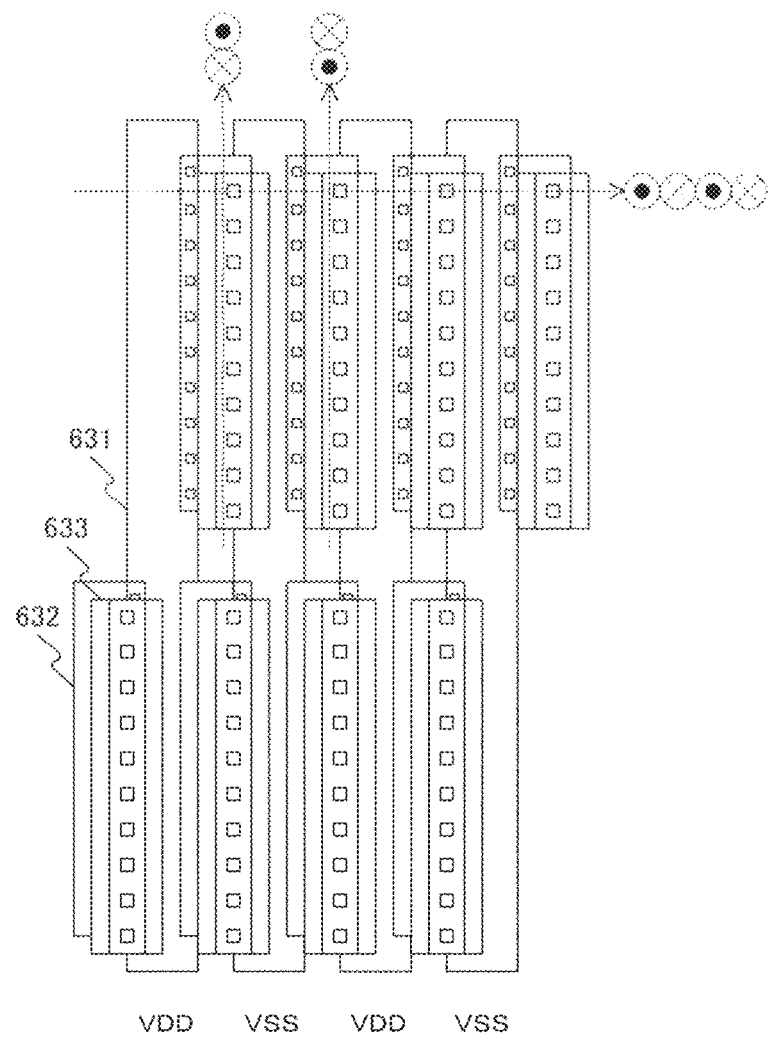
FIG. 37 is a view depicting a second example of arrangement of the power supply wiring in the embodiment of the present technology.

FIG. 37 is a view depicting a second example of arrangement of power supply wirings in the embodiment of the present technology.

In this example, power supply wirings 632 are arranged such that a VDD power supply and a VSS power supply are placed alternately in the vertical direction taking the influence of a magnetic field described above into consideration. By this, a change of the induced electromotive force by an influence of a magnetic field can be suppressed. Further, by connecting the wiring use 633 to the power supply wiring 632 by riveting, the wiring resistance can be decreased.

[Reinforcement of Digital Power Supply]

Figure 38:
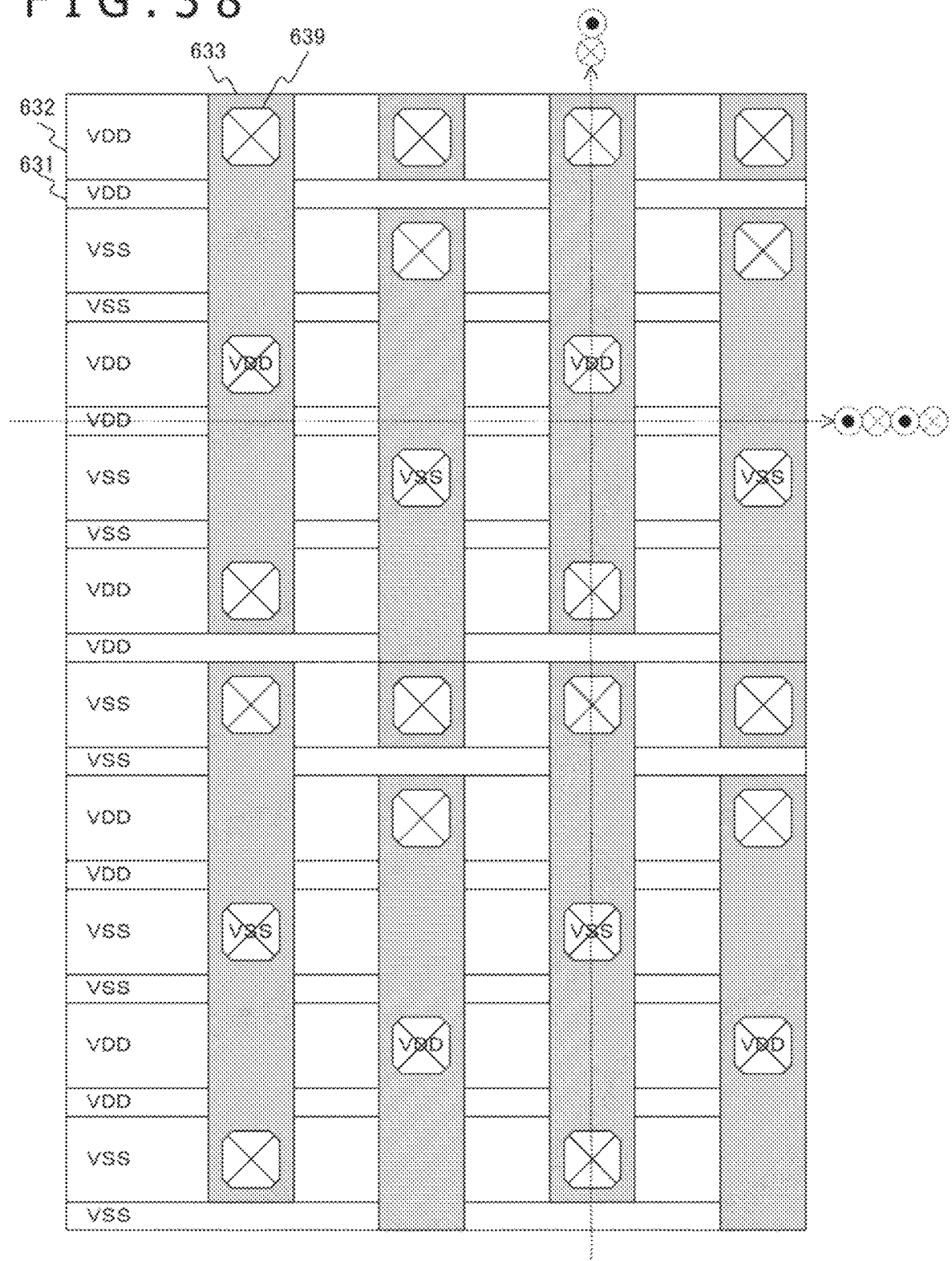
FIG. 38 is a plan view depicting a first example of arrangement of a digital power supply wiring in the embodiment of the present technology.
Figure 39:
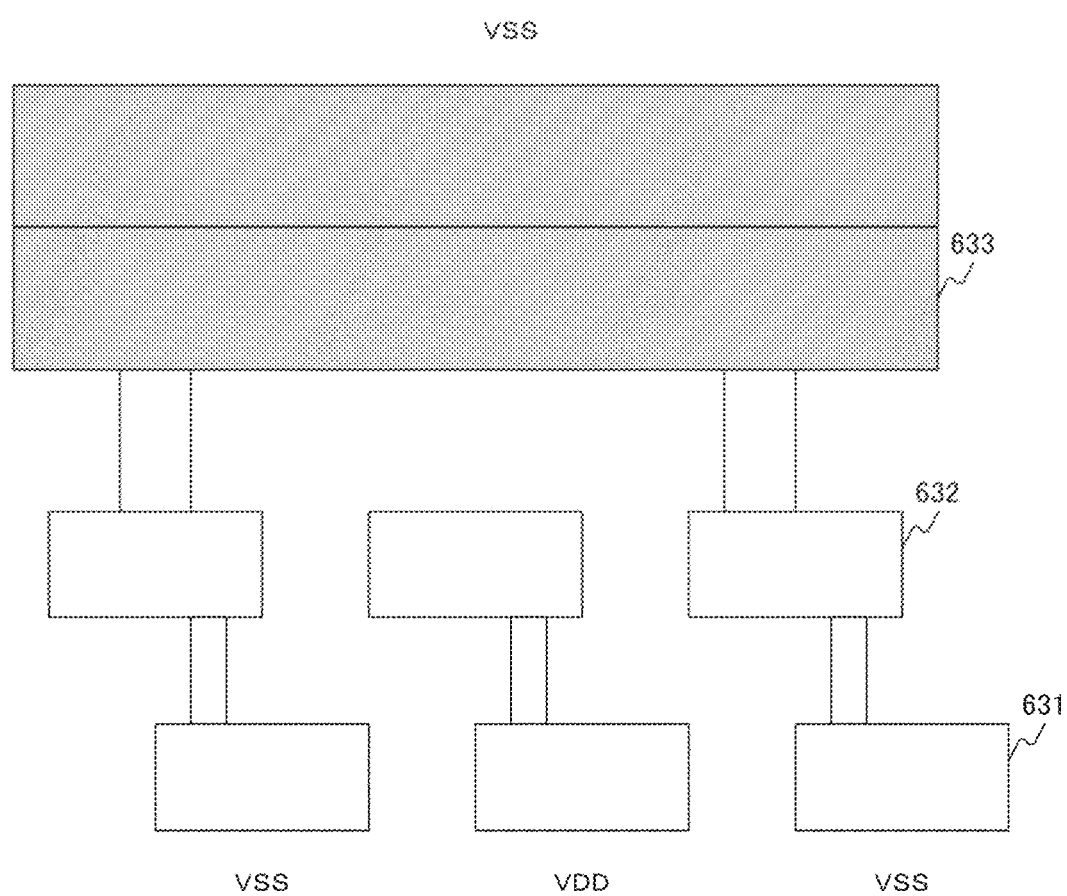
FIG. 39 is a sectional view depicting the first example of arrangement of the digital power supply wiring in the embodiment of the present technology.

FIGS. 38 and 39 are views depicting a first example of arrangement of digital power supply wirings in the embodiment of the present technology.

In this example, power supply wirings 631 and 632 are power-supply wired in the horizontal direction and the power supply is reinforced in the vertical direction by the wiring use 633. By this, while both the light shielding property and power supply reinforcement are achieved, it is possible to increase resources of signal wirings. Further, by devising such that VDD power supplies or VSS power supplies are not arranged successively in both the horizontal direction and the vertical direction, the influence of a magnetic field can be cancelled.

Figure 40:
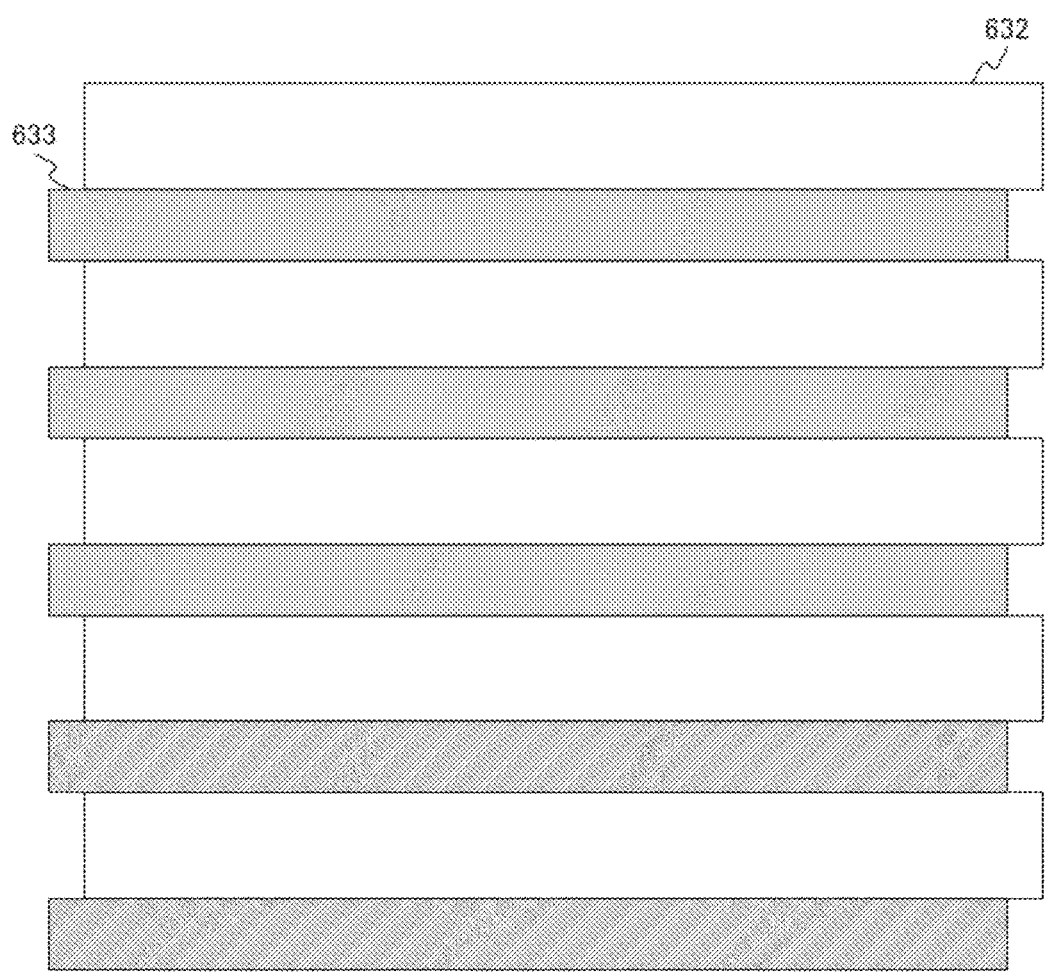
FIG. 40 is a plan view depicting a second example of arrangement of the digital power supply wiring in the embodiment of the present technology.

FIG. 40 is a view depicting a second example of arrangement of digital power supply wirings in the embodiment of the present technology.

In this example, both power supply wirings 632 that are a metal layer of the uppermost layer and the wiring uses 633 are wired in the horizontal direction. By this, a light-shielding property and noise resistance can be achieved.

[Leading Out of Wiring from Input/Output Pad]

Figure 41:
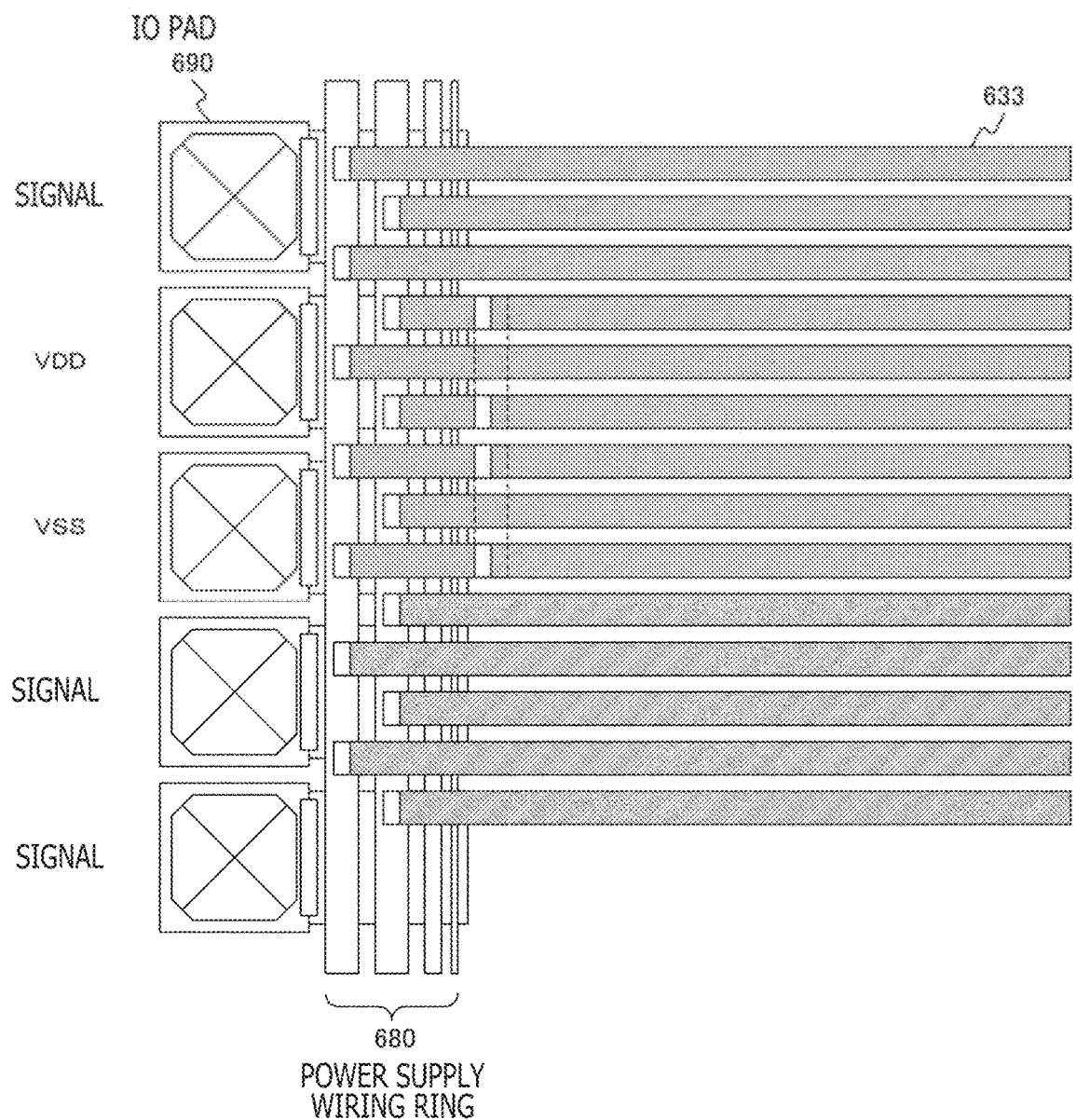
FIG. 41 is a view depicting an example of wiring leading out from an input/output pad 690 in the embodiment of the present technology.

FIG. 41 is a view depicting an example of leading out of a wiring from an input/output pad 690 in the embodiment of the present technology.

In this example, leading out of a power supply wiring from an input/output pad 690 of the second semiconductor substrate 82 is implemented by leading out from the power supply wiring ring 680 by the wiring use 633. In particular, the wiring use 633 is crossed with an aluminum layer of the power supply wiring ring 680 and pulled up by a connection hole. By this, the resistance caused by pulling in can be suppressed.

It is to be noted that, although the present example described relates to an example in which the wiring use 633 is passed on the upper side of the power supply wiring ring 680, in the case where an analog or digital macro or the like including the uppermost layer metal is arranged further on the inner side of the wiring use 633, it is conceivable to pass the wiring use 633 above them. By this, a surplus region for laying bypassing the power supply wiring 632 can be omitted.

[Reduction in Resistance of Power Supply Wiring Ring]

FIG. 42 is a view depicting an example of application of the wiring use 683 to the power supply wiring ring 680 in the embodiment of the present technology.

This example indicates an example in which the wiring use 683 is connected by riveting to a wiring 682 in the power supply wiring ring 680 of the second semiconductor substrate 82. By this, the resistance of a resistance bus to be connected to the input/output pad 690 can be reduced, and the restriction in arrangement in the floor plan can be moderated.

Figure 43:
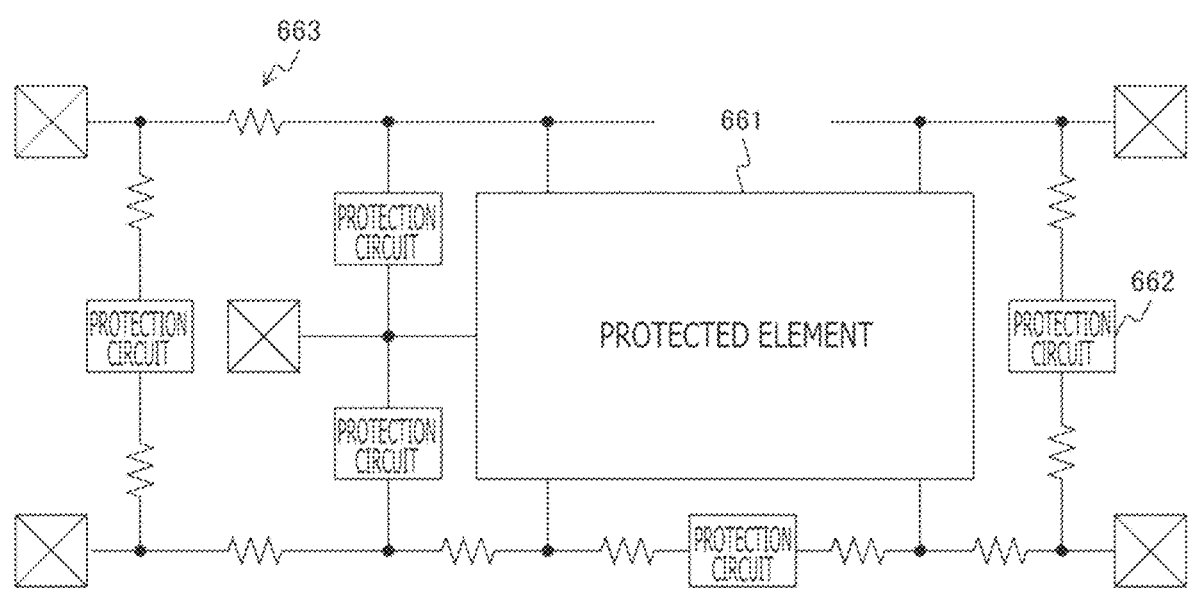
FIG. 43 is a view depicting an example of a resistance bus connected to the input/output pad 690 in the embodiment of the present technology.

FIG. 43 is a view depicting an example of a resistance bus connected to the input/output pad 690 in the embodiment of the present technology.

The resistance bus connected to the input/output pad 690 includes a plurality of resistor 663. In the resistance bus, a protection circuit 662 for protecting a protected element 661 from discharge of static electricity (ESD: Electro-Static Discharge) is provided. In contrast, by providing the wiring use 683 as described hereinabove, the resistance of the resistance bus can be reduced.

In such a manner, according to the embodiment of the present technology, by using a conductor on the surface of a substrate as a wiring, effective use of a region in the proximity of a joining plane of the semiconductor substrate can be achieved. Further, by increasing the paths for current, reduction of the wiring resistance can be achieved.

<6. Example of Application to Endoscopic Surgery System>

The technology according to the present disclosure (present technology) can be applied to various products. For example, the technology according to the present disclosure may be applied to an endoscopic surgery system.

Figure 44:
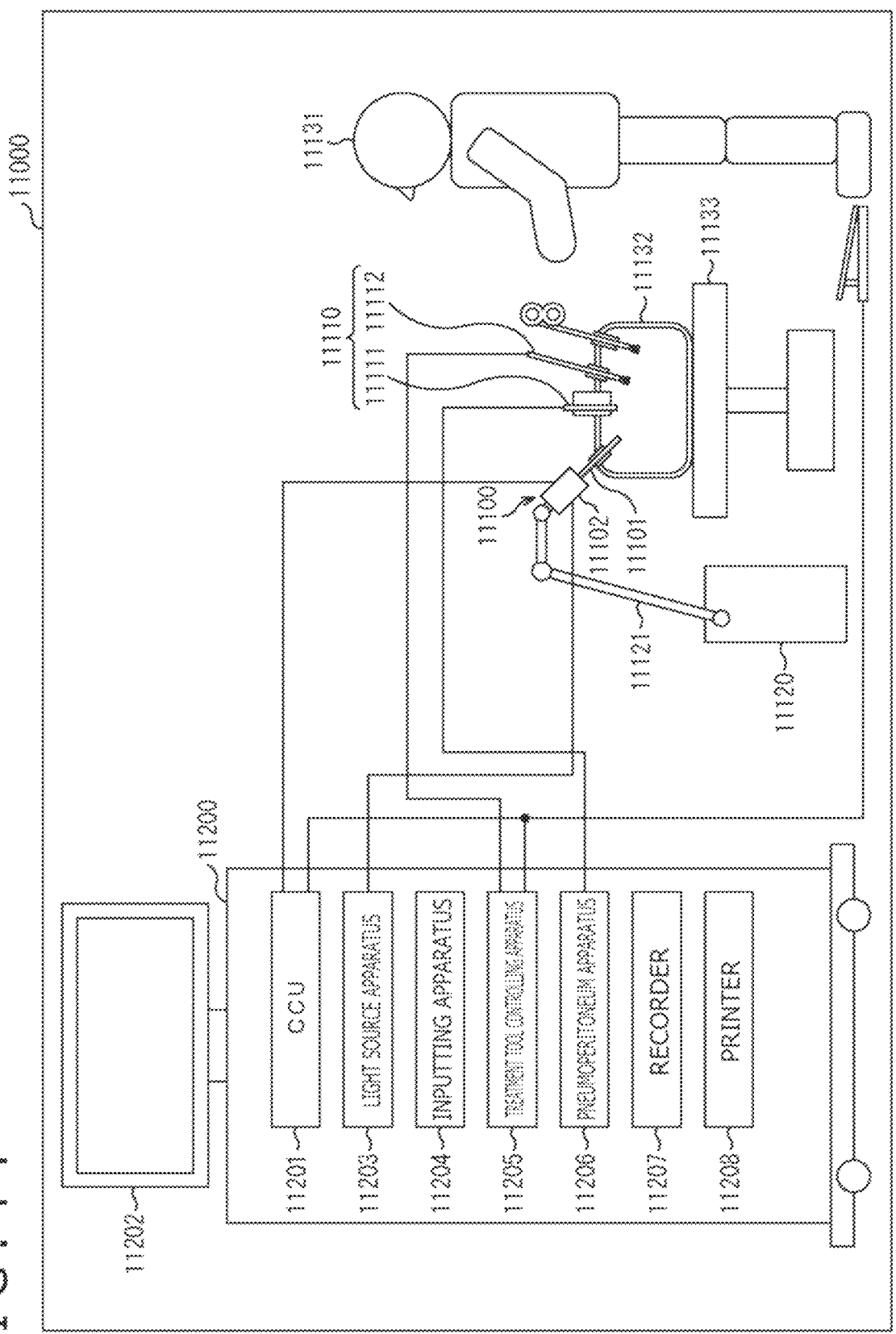
FIG. 44 is a view depicting an example of a schematic configuration of an endoscopic surgery system.

FIG. 44 is a view depicting an example of a schematic configuration of an endoscopic surgery system to which the technology according to an embodiment of the present disclosure (present technology) can be applied.

In FIG. 44, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 45:
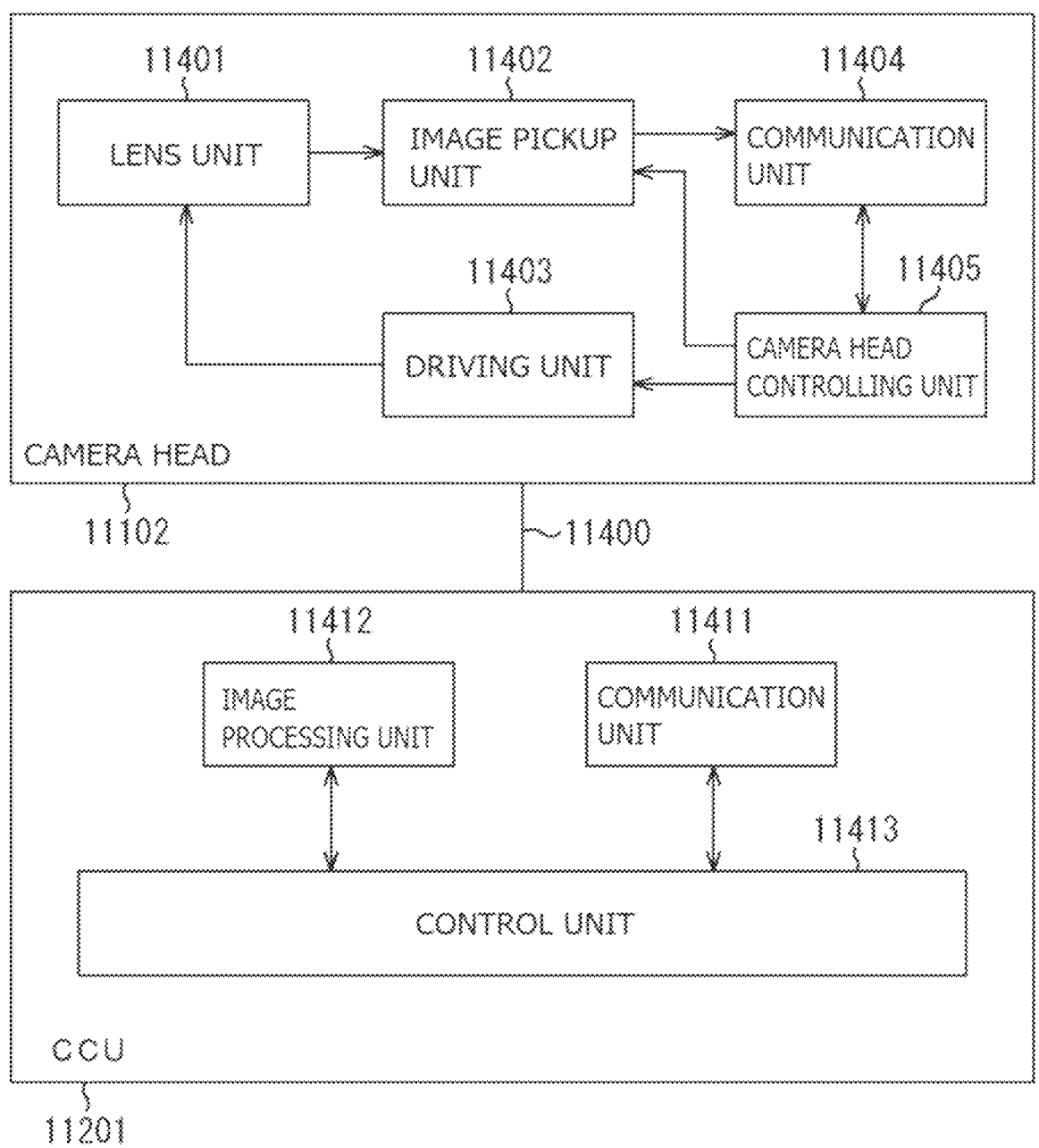
FIG. 45 is a block diagram depicting an example of a functional configuration of a camera head and a camera control unit (CCU).

FIG. 45 is a block diagram depicting an example of a functional configuration of the camera head 11102 and the CCU 11201 depicted in FIG. 44.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described. The technology according to the present disclosure can be applied to the image pickup unit 11402. In particular, effective use of a region in the proximity of the joining plane of the semiconductor substrates in the image pickup unit 11402 can be achieved.

It is to be noted here that, although the endoscopic surgery system has been described as an example, the technology according to the present disclosure may be applied further, for example, to a microscopic surgery system and so forth.

<7. Example of Application to Mobile Body>

The technology according to the present disclosure (present technology) can be applied to various products. For example, the technology according to the present disclosure may be implemented as an apparatus that is incorporated in a mobile body of any kind such as an automobile, an electric car, a hybrid electric car, a motorcycle, a bicycle, a personal mobility, an airplane, a drone, a ship, or a robot.

Figure 46:
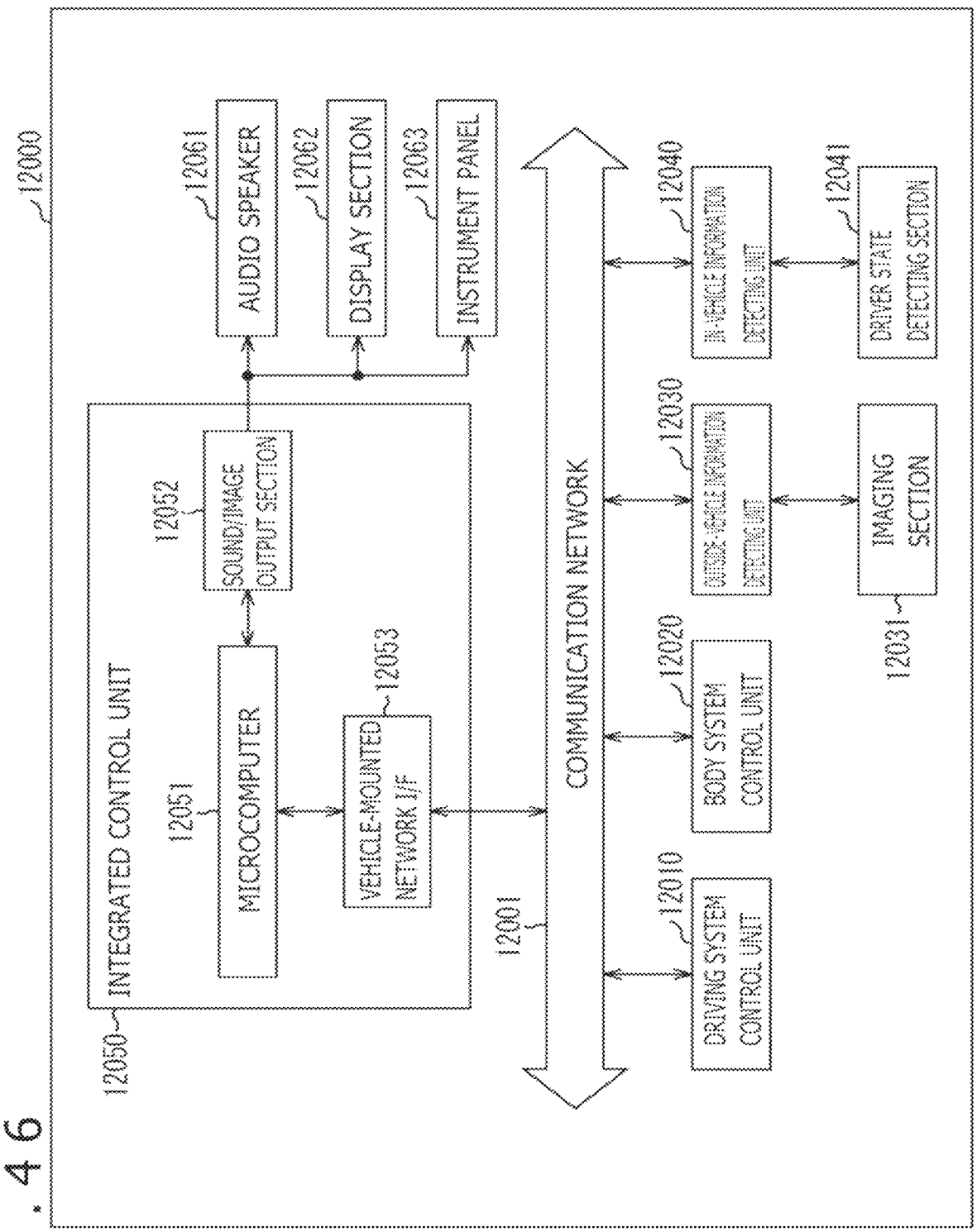
FIG. 46 is a block diagram depicting an example of schematic configuration of a vehicle control system.

FIG. 46 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 46, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 46, an audio speaker 12061, a display section 12062, and an instrument panel 12063 are illustrated as the output device. The display section 12062 may, for example, include at least one of an on-board display and a head-up display.

Figure 47:
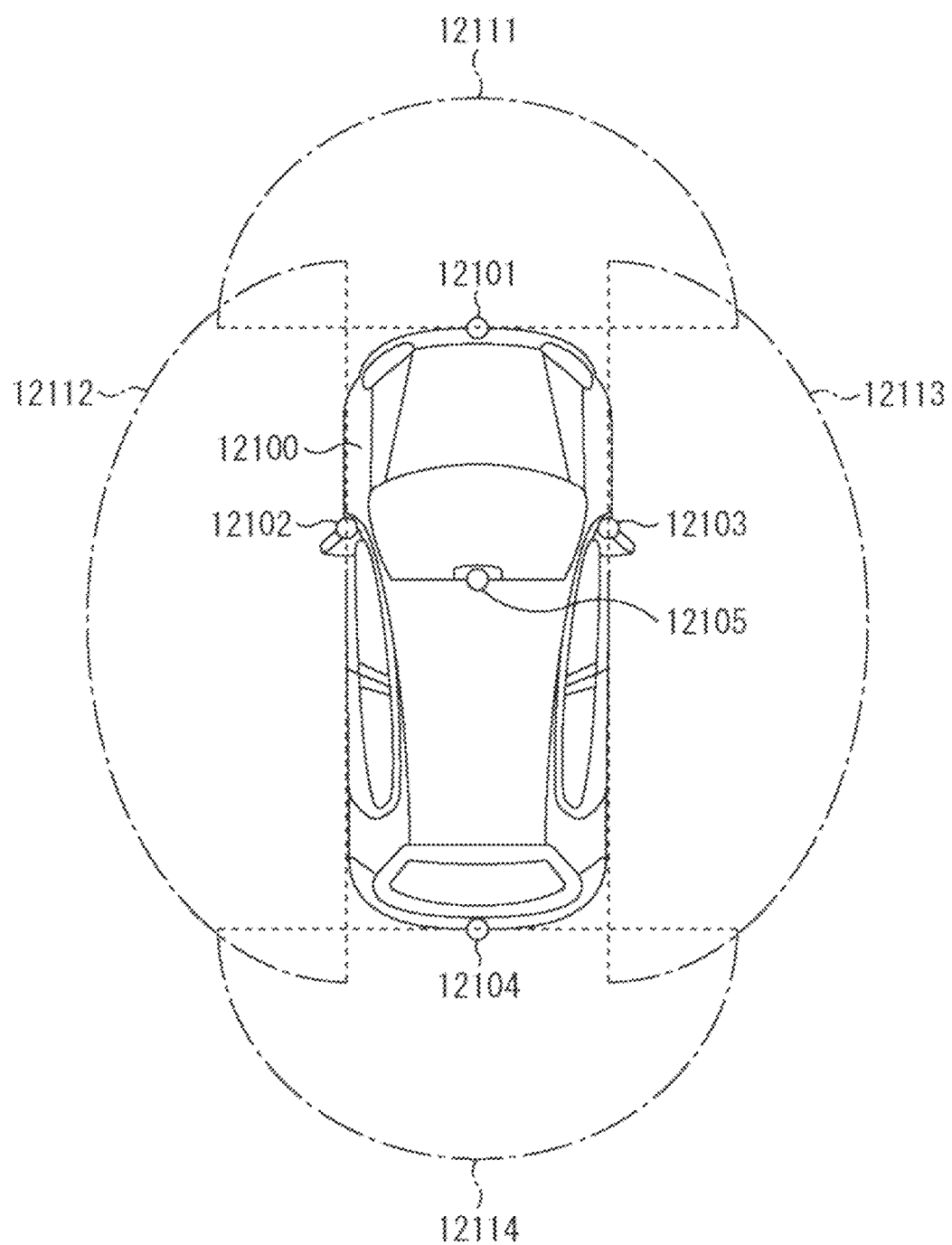
FIG. 47 is a diagram of assistance in explaining an example of installation positions of an outside-vehicle information detecting section and an imaging section.

FIG. 47 is a diagram depicting an example of the installation position of the imaging section 12031.

In FIG. 47, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 47 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described. The technology according to the present disclosure can be applied to the imaging section 12031. In particular, effective use of a region in the proximity of the joining plane of the semiconductor substrates in the imaging section 12031 can be achieved.

It is to be noted that the embodiment described above indicates an example for embodying the present technology and matters in the embodiment and matters specifying the invention in the claims individually have correspondence. Similarly, the matters specifying the invention in the claims and matters in the embodiment of the present technology for which same names are used individually have correspondence. However, the present technology is not restricted to the embodiment and can be embodied by applying various modifications to the embodiment without departing from the scope of the present technology.

It is to be noted that it is also possible for the present technology to have such configurations as described below.

(1)

A semiconductor device, in which, in a stacked semiconductor substrate in which plural semiconductor substrates on each of which a multilayer wiring layer is formed are joined together with the multilayer wiring layers electrically connected to each other, a conductor formed in a proximity of a joining plane of the plurality of semiconductor substrates is electrified in a direction of the joining plane.

(2)

The semiconductor device according to (1) above, in which at least some of the conductors formed in the proximity of the joining plane has a plane long side equal to or greater than twice a width of a connection hole connection face.

(3)

The semiconductor device according to (1) or (2) above, in which only one of the conductors opposing on the joining plane to at least some of the conductors formed in the proximity of the joining plane have a connection hole in the semiconductor substrate.

(4)

The semiconductor device according to any one of (1) to (3) above, in which at least some of the conductors formed in the proximity of the joining plane are not electrically connected to the conductor on the other semiconductor substrate.

(5)

The semiconductor device according to any one of (1) to (4) above, in which
at least some of the conductors formed in the proximity of the joining plane are different in shape from the conductor opposing thereto on the joining plane.

(6)

The semiconductor device according to any one of (1) to (5) above, in which
at least some of the conductors formed in the proximity of the joining plane are joined to the conductor opposing thereto on the joining plane in a displaced relation by a predetermined direction in a direction of the joining plane.

(7)

The semiconductor device according to any one of (1) to (6) above, in which
at least some of the conductors formed in the proximity of the joining plane have a shape having a plane aspect ratio higher than one.

(8)

The semiconductor device according to (7) above, in which
at least some of the conductors formed in the proximity of the joining plane are joined to the conductor opposed thereto on the joining plane so as to cross with each other in a longitudinal direction on the joining plane.

(9)

The semiconductor device according to (7) above, in which
at least some of the conductors formed in the proximity of the joining plane are joined to the conductor opposed thereto on the joining plane so as to extend in parallel in a longitudinal direction on the joining plane.

(10)

The semiconductor device according to any one of (1) to (9) above, in which
at least some of the conductors formed in the proximity of the joining plane have a rectangular shape or an elliptical shape having a plane aspect ratio higher than one.

(11)

The semiconductor device according to any one of (1) to (9) above, in which
at least some of the conductors formed in the proximity of the joining plane have a polygonal shape configured from a combination of rectangles having a plane aspect ratio higher than one.

(12)

The semiconductor device according to any one of (1) to (11) above, in which
at least some of the conductors formed in the proximity of the joining plane are provided in a region that surrounds an inner side circumference of an input/output pad.

(13)

The semiconductor device according to any one of (1) to (11) above, in which
at least some of the conductors formed in the proximity of the joining plane are provided in a rectangular region on an inner side of an input/output pad.

(14)

The semiconductor device according to any one of (1) to (11) above, in which
at least some of the conductors formed in the proximity of the joining plane are provided in parallel to a power supply wiring.

REFERENCE SIGNS LIST

10 Imaging element
11 Pixel
12 Current path
19 Vertical signal line (VSL)
20 Vertical driving circuit
30 Horizontal driving circuit
40 Control circuit
50 Column signal processing circuit
59 Horizontal signal line
60 Outputting circuit
81, 82 Semiconductor substrate
83 Pixel region
84 Control circuit
85 Logic circuit
86 Analog circuit
91 Dummy copper wiring
92 Copper wiring having connection hole
93 Copper wiring of wiring use
94 Copper wiring of shield use
98 Input/output (IC)) pad
99 Joining plane
100 Solid-state imaging device
200, 300, 400, 600 Semiconductor substrate
201 to 203, 301 to 303 Copper wiring
209, 309 Connection hole
610 Logic circuit
620 Analog macro
631 Power supply wiring (lower layer with respect to uppermost layer)
632 Power supply wiring (uppermost layer)
633 Wiring use
661 Protected element
662 Protection circuit
663 Resistor
680 Power supply wiring ring
682 Wiring
683 Wiring use
690 Input/output (IC)) pad

What is claimed is:

1. A semiconductor device, comprising:
a first semiconductor substrate including a first multilayer wiring layer; and
a second semiconductor substrate including a second multilayer wiring layer, wherein the first semiconductor substrate and the second semiconductor substrate are joined together with the first multilayer wiring layer and the second multilayer wiring layer directly connected to each other to form a plurality of conductors in a proximity of a joining plane of the of the first and second semiconductor substrates, wherein connection holes are formed in either or both of the first multilayer wiring layer and the second multilayer wiring layer, wherein rivets are fitted to the connection holes, and wherein the plurality of conductors are electrified in a direction of the joining plane.

2. The semiconductor device according to claim 1, wherein
at least some of the plurality of conductors formed in the proximity of the joining plane have a plane long side equal to or greater than twice a width of a connection hole connection face.

3. The semiconductor device according to claim 1, wherein
only one of the first multilayer wiring layer and the second multilayer wiring layer has the connection holes.

4. The semiconductor device according to claim 1, wherein
at least some of the plurality of conductors formed in the proximity of the joining plane on a side of the first semiconductor substrate are not electrically connected to an opposing conductor on a side of the second semiconductor substrate.

5. The semiconductor device according to claim 1, wherein
at least some of the plurality of conductors formed in the proximity of the joining plane are different in shape from an opposing conductor.

6. The semiconductor device according to claim 1, wherein
at least some of the plurality of conductors formed in the proximity of the joining plane are arranged in a displaced relation to an opposing conductor by a predetermined direction in a direction of the joining plane.

7. The semiconductor device according to claim 1, wherein
at least some of the plurality of conductors formed in the proximity of the joining plane have a shape having a plane aspect ratio higher than one.

8. The semiconductor device according to claim 7, wherein
at least some of the plurality of conductors formed in the proximity of the joining plane are joined to an opposed conductor on the joining plane so as to cross with each other in a longitudinal direction on the joining plane.

9. The semiconductor device according to claim 7, wherein
at least some of the plurality of conductors formed in the proximity of the joining plane are joined to an opposed conductor on the joining plane so as to extend in parallel in a longitudinal direction on the joining plane.

10. The semiconductor device according to claim 1, wherein
at least some of the plurality of conductors formed in the proximity of the joining plane have a rectangular shape or an elliptical shape having a plane aspect ratio higher than one.

11. The semiconductor device according to claim 1, wherein
at least some of the plurality of conductors formed in the proximity of the joining plane has a polygonal shape configured from a combination of rectangles having a plane aspect ratio higher than one.

12. The semiconductor device according to claim 1, wherein
at least some of the plurality of conductors formed in the proximity of the joining plane are provided in a region that surrounds an inner side circumference of an input/output pad.

13. The semiconductor device according to claim 1, wherein
at least some of the plurality of conductors formed in the proximity of the joining plane are provided in a rectangular region on an inner side of an input/output pad.

14. The semiconductor device according to claim 1, wherein
at least some of the plurality of conductors formed in the proximity of the joining plane are provided in parallel to a power supply wiring.

* * * * *